(12) United States Patent
Kim et al.

(10) Patent No.: US 7,906,855 B1
(45) Date of Patent: Mar. 15, 2011

(54) STACKED SEMICONDUCTOR PACKAGE AND METHOD OF MAKING SAME

(75) Inventors: Yoon Joo Kim, Nowon-gu (KR); In Tae Kim, Buk-gu (KR); Ji Young Chung, Gunpo-si (KR); Bong Chan Kim, Seongnam-si (KR); Do Hyung Kim, Gunpo-si (KR); Sung Chul Ha, Gwangsan-gu (KR); Sung Min Lee, Gwangsan-gu (KR); Jae Kyu Song, Yongin-si (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/758,583

(22) Filed: Apr. 12, 2010

Related U.S. Application Data

(63) Continuation of application No. 12/017,266, filed on Jan. 21, 2008, now Pat. No. 7,723,852.

(51) Int. Cl.
*H01L 23/48* (2006.01)

(52) U.S. Cl. . 257/777; 257/686; 257/790; 257/E23.085; 257/E23.126; 438/26; 438/107; 438/109

(58) Field of Classification Search .................. 257/686, 257/777, 790, E23.085, E23.126; 438/26, 438/107, 109
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |

(Continued)

FOREIGN PATENT DOCUMENTS

DE          19734794 A1      7/1998

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Jasmine J Clark
(74) *Attorney, Agent, or Firm* — Stetina Brunda Garred & Brucker

(57) ABSTRACT

In accordance with the present invention, there is provided multiple embodiments of a semiconductor package including two or more semiconductor dies which are electrically connected to an underlying substrate through the use of conductive wires, some of which may be fully or partially encapsulated by an adhesive or insulating layer of the package. In a basic embodiment of the present invention, the semiconductor package comprises a substrate having a conductive pattern disposed thereon. Electrically connected to the conductive pattern of the substrate are first and second semiconductor dies. The first semiconductor die and a portion of the substrate are covered by an adhesive layer. The second semiconductor die, the adhesive layer and a portion of the substrate are in turn covered by a package body of the semiconductor package.

20 Claims, 19 Drawing Sheets

U.S. PATENT DOCUMENTS

| | | |
|---|---|---|
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp et al. |
| 4,812,896 A | 3/1989 | Rothgery et al. |
| 4,862,245 A | 8/1989 | Pashby et al. |
| 4,862,246 A | 8/1989 | Masuda |
| 4,907,067 A | 3/1990 | Derryberry |
| 4,920,074 A | 4/1990 | Shimizu et al. |
| 4,935,803 A | 6/1990 | Kalfus |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi |
| 5,134,773 A | 8/1992 | LeMaire |
| 5,151,039 A | 9/1992 | Murphy |
| 5,157,475 A | 10/1992 | Yamaguchi |
| 5,157,480 A | 10/1992 | McShane |
| 5,168,368 A | 12/1992 | Gow |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto |
| 5,278,446 A | 1/1994 | Nagaraj et al. |
| 5,279,029 A | 1/1994 | Burns |
| 5,281,849 A | 1/1994 | Singh Deo |
| 5,285,352 A | 2/1994 | Pastore et al. |
| 5,294,897 A | 3/1994 | Notani |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire |
| 5,424,576 A | 6/1995 | Djennas et al. |
| 5,428,248 A | 6/1995 | Cha |
| 5,434,057 A | 7/1995 | Dorian |
| 5,444,301 A | 8/1995 | Song |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono |
| 5,528,076 A | 6/1996 | Pavio |
| 5,534,467 A | 7/1996 | Rostoker |
| 5,539,251 A | 7/1996 | Iverson |
| 5,543,657 A | 8/1996 | Diffenderfer |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda |
| 5,633,528 A | 5/1997 | Abbott |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda |
| 5,726,493 A | 3/1998 | Yamashita et al. |
| 5,736,432 A | 4/1998 | Mackessy |
| 5,745,984 A | 5/1998 | Cole |
| 5,753,532 A | 5/1998 | Sim |
| 5,753,977 A | 5/1998 | Kusaka |
| 5,766,972 A | 6/1998 | Takahashi et al. |
| 5,770,888 A | 6/1998 | Song |
| 5,776,798 A | 7/1998 | Quan et al. |
| 5,783,861 A | 7/1998 | Son |
| 5,801,440 A | 9/1998 | Chu |
| 5,814,877 A | 9/1998 | Diffenderfer |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki |
| 5,877,043 A | 3/1999 | Alcoe et al. |
| 5,886,397 A | 3/1999 | Ewer |
| 5,973,935 A | 10/1999 | Schoenfeld |
| 5,977,630 A | 11/1999 | Woodworth et al. |
| RE36,773 E | 7/2000 | Nomi et al. |
| 6,107,679 A | 8/2000 | Noguchi |
| 6,143,981 A | 11/2000 | Glenn |
| 6,166,430 A | 12/2000 | Yamaguchi |
| 6,169,329 B1 | 1/2001 | Farnworth |
| 6,177,718 B1 | 1/2001 | Kozono |
| 6,181,002 B1 | 1/2001 | Juso et al. |
| 6,184,465 B1 | 2/2001 | Corisis |

| | | | |
|---|---|---|---|
| 6,184,573 B1 | 2/2001 | Pu | |
| 6,194,777 B1 | 2/2001 | Abbott | |
| 6,197,615 B1 | 3/2001 | Song | |
| 6,198,171 B1 | 3/2001 | Huang | |
| 6,201,186 B1 | 3/2001 | Daniels et al. | |
| 6,201,292 B1 | 3/2001 | Yagi et al. | |
| 6,204,554 B1 | 3/2001 | Ewer | |
| 6,208,020 B1 | 3/2001 | Minamio et al. | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. | |
| 6,218,731 B1 | 4/2001 | Huang et al. | |
| 6,222,258 B1 | 4/2001 | Asano et al. | |
| 6,222,259 B1 | 4/2001 | Park | |
| 6,225,146 B1 | 5/2001 | Yamaguchi et al. | |
| 6,229,200 B1 | 5/2001 | Mclellan | |
| 6,229,205 B1 | 5/2001 | Jeong | |
| 6,239,367 B1 | 5/2001 | Hsuan | |
| 6,239,384 B1 | 5/2001 | Smith | |
| 6,242,281 B1 | 6/2001 | Mclellan et al. | |
| 6,256,200 B1 | 7/2001 | Lam et al. | |
| 6,258,629 B1 | 7/2001 | Niones et al. | |
| 6,281,566 B1 | 8/2001 | Magni | |
| 6,281,568 B1 | 8/2001 | Glenn et al. | |
| 6,282,094 B1 | 8/2001 | Lo et al. | |
| 6,282,095 B1 | 8/2001 | Houghton | |
| 6,285,075 B1 | 9/2001 | Combs | |
| 6,291,271 B1 | 9/2001 | Lee | |
| 6,291,273 B1 | 9/2001 | Miyaki et al. | |
| 6,294,100 B1 | 9/2001 | Fan | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,303,984 B1 | 10/2001 | Corisis | |
| 6,303,997 B1 | 10/2001 | Lee | |
| 6,307,272 B1 | 10/2001 | Takahashi | |
| 6,309,909 B1 | 10/2001 | Ohgiyama | |
| 6,316,822 B1 | 11/2001 | Venkateshwaran | |
| 6,316,838 B1 | 11/2001 | Ozawa et al. | |
| 6,323,550 B1 | 11/2001 | Martin | |
| 6,326,243 B1 | 12/2001 | Suzuya et al. | |
| 6,326,244 B1 | 12/2001 | Brooks | |
| 6,326,678 B1 | 12/2001 | Karnezos et al. | |
| 6,335,564 B1 | 1/2002 | Pour | |
| 6,337,510 B1 | 1/2002 | Chun-Jen et al. | |
| 6,339,255 B1 | 1/2002 | Shin | |
| 6,348,726 B1 | 2/2002 | Bayan | |
| 6,355,502 B1 | 3/2002 | Kang et al. | |
| 6,359,221 B1 | 3/2002 | Yamada et al. | |
| 6,362,525 B1 | 3/2002 | Rahim | |
| 6,369,447 B2 | 4/2002 | Mori | |
| 6,369,454 B1 | 4/2002 | Chung | |
| 6,373,127 B1 | 4/2002 | Baudouin et al. | |
| 6,377,464 B1 | 4/2002 | Hashemi et al. | |
| 6,380,048 B1 | 4/2002 | Boon et al. | |
| 6,384,472 B1 | 5/2002 | Huang | |
| 6,388,336 B1 | 5/2002 | Venkateshwaran | |
| 6,395,578 B1 | 5/2002 | Shin et al. | |
| 6,399,415 B1 | 6/2002 | Bayan et al. | |
| 6,400,004 B1 | 6/2002 | Fan et al. | |
| 6,410,979 B2 | 6/2002 | Abe | |
| 6,414,385 B1 | 7/2002 | Huang | |
| 6,420,779 B1 | 7/2002 | Sharma et al. | |
| 6,421,013 B1 | 7/2002 | Chung | |
| 6,429,508 B1 | 8/2002 | Gang | |
| 6,444,499 B1 | 9/2002 | Swiss | |
| 6,448,633 B1 | 9/2002 | Yee et al. | |
| 6,452,279 B2 | 9/2002 | Shimoda | |
| 6,459,148 B1 | 10/2002 | Chun-Jen et al. | |
| 6,464,121 B2 | 10/2002 | Reijnders | |
| 6,465,883 B2 | 10/2002 | Olofsson | |
| 6,472,735 B2 | 10/2002 | Isaak | |
| 6,472,758 B1 | 10/2002 | Glenn et al. | |
| 6,475,646 B2 | 11/2002 | Park et al. | |
| 6,476,469 B2 | 11/2002 | Hung et al. | |
| 6,476,474 B1 | 11/2002 | Hung | |
| 6,482,680 B1 | 11/2002 | Khor | |
| 6,483,178 B1 | 11/2002 | Chuang | |
| 6,492,718 B2 | 12/2002 | Ohmori | |
| 6,498,099 B1 | 12/2002 | McLellan | |
| 6,498,392 B2 | 12/2002 | Azuma | |
| 6,507,096 B2 | 1/2003 | Gang | |
| 6,507,120 B2 | 1/2003 | Lo | |
| 6,518,089 B2 | 2/2003 | Coyle | |
| 6,525,942 B2 | 2/2003 | Huang | |
| 6,534,849 B1 | 3/2003 | Gang | |
| 6,545,332 B2 | 4/2003 | Huang | |
| 6,545,345 B1 | 4/2003 | Glenn et al. | |
| 6,552,421 B2 | 4/2003 | Kishimoto et al. | |
| 6,559,525 B2 | 5/2003 | Huang | |
| 6,566,168 B2 | 5/2003 | Gang | |
| 6,580,161 B2 | 6/2003 | Kobayakawa | |
| 6,583,503 B2 | 6/2003 | Akram | |
| 6,603,196 B2 | 8/2003 | Lee | |
| 6,624,005 B1 | 9/2003 | DiCaprio | |
| 6,646,339 B1 | 11/2003 | Ku | |
| 6,667,546 B2 | 12/2003 | Huang et al. | |
| 6,677,663 B1 | 1/2004 | Ku | |
| 6,686,649 B1 | 2/2004 | Mathews et al. | |
| 6,700,189 B2 | 3/2004 | Shibata | |
| 6,713,375 B2 | 3/2004 | Shenoy | |
| 6,757,178 B2 | 6/2004 | Okabe | |
| 6,800,936 B2 | 10/2004 | Kosemura et al. | |
| 6,812,552 B2 | 11/2004 | Islam et al. | |
| 6,858,919 B2 | 2/2005 | Seo et al. | |
| 6,867,492 B2 | 3/2005 | Auburger et al. | |
| 6,878,571 B2 | 4/2005 | Isaak et al. | |
| 6,885,093 B2 | 4/2005 | Lo et al. | |
| 6,897,552 B2 | 5/2005 | Nakao | |
| 6,927,478 B2 | 8/2005 | Paek | |
| 7,002,805 B2 | 2/2006 | Lee et al. | |
| 7,005,327 B2 | 2/2006 | Kung | |
| 7,015,571 B2 | 3/2006 | Chang | |
| 7,053,469 B2 | 5/2006 | Koh et al. | |
| 7,091,623 B2 | 8/2006 | Tsai et al. | |
| 7,102,209 B1 | 9/2006 | Bayan et al. | |
| 7,185,426 B1 | 3/2007 | Hiner et al. | |
| 7,211,471 B1 | 5/2007 | Foster | |
| 7,245,007 B1 | 7/2007 | Foster | |
| 7,253,503 B1 | 8/2007 | Fusaro et al. | |
| 7,723,852 B1 * | 5/2010 | Kim et al. | 257/777 |
| 2001/0008305 A1 | 7/2001 | McLellan et al. | |
| 2001/0014538 A1 | 8/2001 | Kwan et al. | |
| 2002/0011654 A1 | 1/2002 | Kimura | |
| 2002/0024122 A1 | 2/2002 | Jung | |
| 2002/0027297 A1 | 3/2002 | Ikenaga et al. | |
| 2002/0038873 A1 | 4/2002 | Hiyoshi | |
| 2002/0072147 A1 | 6/2002 | Sayanagi et al. | |
| 2002/0111009 A1 | 8/2002 | Huang et al. | |
| 2002/0140061 A1 | 10/2002 | Lee | |
| 2002/0140068 A1 | 10/2002 | Lee | |
| 2002/0140081 A1 | 10/2002 | Chou et al. | |
| 2002/0158318 A1 | 10/2002 | Chen | |
| 2002/0163015 A1 | 11/2002 | Lee et al. | |
| 2002/0167060 A1 | 11/2002 | Buijsman et al. | |
| 2003/0006055 A1 | 1/2003 | Chien-Hung et al. | |
| 2003/0030131 A1 | 2/2003 | Lee | |
| 2003/0059644 A1 | 3/2003 | Datta et al. | |
| 2003/0064548 A1 | 4/2003 | Isaak | |
| 2003/0102537 A1 | 6/2003 | McLellan | |
| 2003/0164554 A1 | 9/2003 | Fee | |
| 2003/0168719 A1 | 9/2003 | Cheng et al. | |
| 2003/0198032 A1 | 10/2003 | Collander et al. | |
| 2004/0027788 A1 | 2/2004 | Chiu | |
| 2004/0056277 A1 | 3/2004 | Karnezos | |
| 2004/0061212 A1 | 4/2004 | Karnezos | |
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0065963 A1 | 4/2004 | Karnezos | |
| 2004/0080025 A1 | 4/2004 | Kasahara | |
| 2004/0089926 A1 | 5/2004 | Hsu et al. | |
| 2004/0164387 A1 | 8/2004 | Ikenaga et al. | |
| 2004/0253803 A1 | 12/2004 | Tomono | |
| 2006/0087020 A1 | 4/2006 | Hirano et al. | |
| 2006/0157843 A1 | 7/2006 | Hwang | |
| 2006/0231939 A1 | 10/2006 | Kawabata et al. | |

FOREIGN PATENT DOCUMENTS

| | | | |
|---|---|---|---|
| DE | 19734794 | B4 | 9/2004 |
| EP | 1032037 | A2 | 8/2000 |
| EP | 1032037 | A3 | 4/2001 |
| EP | 1032037 | B1 | 6/2004 |
| JP | 992775 | C | 4/1980 |
| JP | 55163868 | U | 11/1980 |
| JP | 55163868 | A | 12/1980 |
| JP | 1106456 | C | 7/1982 |
| JP | 58160096 | A | 9/1983 |
| JP | 1175250 | C | 10/1983 |
| JP | 58160096 | U | 10/1983 |
| JP | 1205544 | C | 5/1984 |
| JP | 59208756 | A | 11/1984 |
| JP | 59227143 | A | 12/1984 |
| JP | 60010756 | A | 1/1985 |
| JP | 60010756 | U | 1/1985 |
| JP | 1251747 | C | 2/1985 |
| JP | 60010756 | B | 3/1985 |
| JP | 60010756 | Y2 | 4/1985 |
| JP | 60116239 | A | 6/1985 |
| JP | 60116239 | U | 8/1985 |
| JP | 60195957 | A | 10/1985 |
| JP | 60231349 | A | 11/1985 |
| JP | 60195957 | U | 12/1985 |
| JP | 61248541 | A | 11/1986 |
| JP | 63067762 | A | 3/1988 |
| JP | 63067762 | U | 5/1988 |
| JP | 63188964 | A | 8/1988 |
| JP | 63205935 | A | 8/1988 |
| JP | 63233555 | A | 9/1988 |
| JP | 63249345 | A | 10/1988 |
| JP | 63289951 | A | 11/1988 |
| JP | 63067762 | B | 12/1988 |
| JP | 63188964 | U | 12/1988 |
| JP | 63316470 | A | 12/1988 |
| JP | 64054749 | U | 4/1989 |
| JP | 1106456 | U | 7/1989 |
| JP | 1175250 | U | 12/1989 |
| JP | 2129948 | U | 10/1990 |
| JP | 4098864 | U | 8/1992 |
| JP | 6061401 | U | 8/1994 |
| JP | 10022447 | A | 1/1998 |
| JP | 10199934 | A | 7/1998 |
| JP | 10256240 | A | 9/1998 |
| JP | 1106456 | A | 4/1999 |
| JP | 1175250 | A | 7/1999 |
| JP | 1205544 | A | 7/1999 |
| JP | 1251747 | A | 9/1999 |
| JP | 11307675 | A | 11/1999 |
| JP | 2000150765 | A | 5/2000 |
| JP | 3177060 | B2 | 6/2001 |
| JP | 2002519848 | A | 7/2002 |
| JP | 2002519848 | T | 7/2002 |
| JP | 4098864 | B2 | 6/2008 |
| KR | 19940010938 | B1 | 11/1994 |
| KR | 100220154 | B1 | 6/1999 |
| KR | 20000072714 | A | 12/2000 |
| KR | 20020049944 | A | 6/2002 |
| WO | 9956316 | A1 | 11/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

STACKED SEMICONDUCTOR PACKAGE AND METHOD OF MAKING SAME

CROSS-REFERENCE TO RELATED APPLICATIONS

The present application is a continuation of U.S. patent application Ser. No. 12/017,266 entitled STACKED SEMICONDUCTOR PACKAGE AND METHOD OF MAKING SAME filed Jan. 21, 2008 now U.S. Pat. No. 7,723,852.

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package including stacked semiconductor dies which are separated from each other by an adhesive layer alone or in combination with an insulative layer, the semiconductor dies being electrically connected to an underlying substrate through the use of conductive wires, some of which may be fully or partially encapsulated by the adhesive layer.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body. In other semiconductor packages, the metal leadframe is substituted with a laminate substrate to which the semiconductor die is mounted and which includes pads or terminals for mimicking the functionality of the leads and establishing electrical communication with another device.

Once the semiconductor dies have been produced and encapsulated in the semiconductor packages described above, they may be used in a wide variety of electronic devices. The variety of electronic devices utilizing semiconductor packages has grown dramatically in recent years. These devices include cellular phones, portable computers, etc. Each of these devices typically includes a printed circuit board on which a significant number of such semiconductor packages are secured to provide multiple electronic functions. These electronic devices are typically manufactured in reduced sizes and at reduced costs, which results in increased consumer demand. Accordingly, not only are semiconductor dies highly integrated, but also semiconductor packages are highly miniaturized with an increased level of package mounting density.

In currently known semiconductor packages, the electrical connection of the semiconductor die to the leadframe or the underlying substrate is most typically accomplished through the use of electrically conductive wires. As indicated above, these conductive wires are used to electrically connect pads on the semiconductor die to individual leads of the leadframe or the pads or terminals of the substrate. These conductive wires are usually made of gold due to its excellent reliability and electrical conductivity. As also indicated above, these conductive wires are typically covered by the hard plastic encapsulant material which ultimately forms the package body of the semiconductor package. This encapsulant material is often an epoxy molding compound (EMC) which itself has excellent thermal property, electrical property, and a high level of formability, thus making such material well suited to protecting the semiconductor die and the conductive wires.

In addition to the foregoing, even though semiconductor packages have been miniaturized, space on a printed circuit board remains limited and precious. Thus, there is an ongoing need to find semiconductor package designs which maximize the number of semiconductor packages that may be integrated into an electronic device, yet minimize the space needed to accommodate these semiconductor packages. One method to minimize space needed to accommodate the semiconductor packages is to stack the semiconductor packages, individual semiconductor dies, or other devices on top of each other, or to stack the semiconductor dies or other devices within the package body of a semiconductor package. However, in those semiconductor packages including stacked semiconductor dies, there is typically a need to interpose an insulative film between the semiconductor dies to prevent current leakage flow. However, in known stacked die semiconductor package designs, the integration of the insulative film into the semiconductor package often gives rise to difficulties in controlling the thickness thereof. Additionally, stresses and delaminations are sometimes caused due to the differences in the thermal expansion coefficients between the insulative film and those materials to which it is attached within the semiconductor package. Further, in known semiconductor package designs wherein an adhesive film, alone or in combination with an insulative film, is interposed between the stacked dies, manufacturing difficulties are often encountered in stacking a top die on a bottom die when the size of the top die exceeds that of the bottom die. Such manufacturing difficulties include the slow production rates and high production costs attributable to the obstacles which typically arise in attempting to ensure that the encapsulant material used to form the package body of the semiconductor package adequately flows between the top and bottom dies. Therefore, a new solution is needed, such solution being provided by the present invention which is discussed in detail below.

BRIEF SUMMARY OF THE INVENTION

In accordance with the present invention, there is provided multiple embodiments of a semiconductor package including two or more semiconductor dies which are electrically connected to an underlying substrate through the use of conductive wires, some of which may be fully or partially encapsulated by an adhesive or insulating layer of the package. In a basic embodiment of the present invention, the semiconductor package comprises a substrate having a conductive pattern disposed thereon. Electrically connected to the conductive pattern of the substrate are first and second semiconductor dies. The first semiconductor die and a portion of the substrate are covered by an adhesive layer. The second semiconductor die, the adhesive layer and a portion of the substrate are in turn covered by a package body of the semiconductor package.

Further in accordance with the present invention, there is provided methods for facilitating the fabrication of semiconductor packages including two or more semiconductor dies which are electrically connected to an underlying substrate through the use of conductive wires, some of which may be fully or partially encapsulated by an adhesive or insulating layer of the package.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
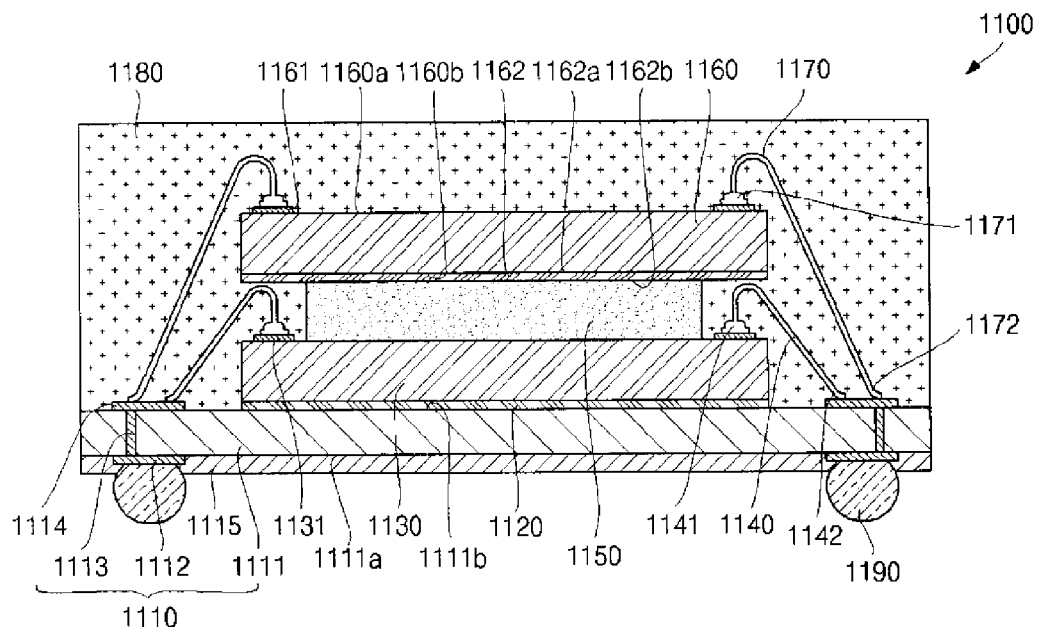
FIG. 1 is a cross-sectional view of a semiconductor package constructed in accordance with a first embodiment of the present invention.

Referring now to the drawings wherein the showings are for purposes of illustrating various embodiments of the present invention only, and not for purposes of limiting the same, FIG. 1 illustrates a semiconductor package 1100 constructed in accordance with a first embodiment of the present invention. The semiconductor package 1100 comprises a substrate 1110 which functions to transmit electrical signals to and from the semiconductor package 1100. The substrate 1110 comprises a thin, plate-like insulative layer 1111 which defines a generally planar first (bottom) surface 1111a and an opposed, generally planar second (top) surface 1111b. The insulative layer 1111 further comprises a third (side) surface which extends generally perpendicularly between the first and second surfaces 1111a, 1111b. The insulative layer 1111 may comprise a base film formed from a thermosetting resin, a polymer, polyimide, or an equivalent material.

The substrate 1110 further comprises one or more electrically conductive lands 1112 which are formed on the first surface 1111a in a prescribed pattern or arrangement. Each of the lands 1112 preferably has a generally circular configuration, though different shapes for the lands 1112 are contemplated to be within the spirit and scope of the present invention. The substrate 1110 also includes an electrically conductive pattern 1114 which is formed on the second surface 1111b. The conductive pattern 1114 may comprise various pads, traces, or combinations thereof. In the substrate 1110, the lands 1112 and the conductive pattern 1114 are electrically connected to each other in a prescribed pattern or arrangement through the use of conductive vias 1113 which extend through the insulative layer 1111 between the first and second surfaces 1111a, 1111b thereof in the manner shown in FIG. 1. In the semiconductor package 1100, it is contemplated that the lands 1112, vias 1113 and conductive pattern 1114 will each be formed from copper or a suitable equivalent material having good electrical conductivity. With particular regard to the vias 1113, it is further contemplated that such vias 1113 may be formed by coating the walls of cylindrical apertures extending through the insulative layer 1111 with a conductive metal film as places the lands 1112 into electrical communication with the conductive pattern 1114 in a prescribed manner.

The substrate 1110 further preferably includes a solder mask 1115 which is formed on the first surface 1111a of the insulative layer 1111. As seen in FIG. 1, the solder mask 1115 is formed to surround and cover a predetermined region of the periphery of each of the lands 1112. Additionally, as is also seen in FIG. 1, it is contemplated that in the substrate 1110, solder balls 1190 will be electrically coupled to respective ones of the lands 1112, such solder balls 1190 being used to transmit electrical signals from the semiconductor package 1100 to an external device. The solder mask 1115, which contacts each of the solder balls 1190, electrically insulates each of the solder balls 1190 from the adjacent lands 1112 on which other solder balls 1190 are formed. The solder mask 1115 is preferably fabricated from a material having a good insulating property, such as benzocyclobutene (BCB) resin, polyimide, and equivalent materials.

The semiconductor package 1100 further comprises a first adhesive layer 1120 which is applied to a central portion of the second surface 1111b of the insulative layer 1111. The first adhesive layer 1120 is preferably formed to be of a prescribed thickness, and is disposed in spaced relation to the conductive pattern 1114 disposed on the second surface 1111b. The first adhesive layer 1120 preferably has a strong viscosity, and may comprise an epoxy, adhesive tape, or an equivalent material, the present invention not being limited to any particular material for the first adhesive layer 1120.

The semiconductor package 1100 further comprises a first semiconductor die 1130 which is attached to the substrate 1110, and in particular to the first adhesive layer 1120 in the manner shown in FIG. 1. In this regard, the first semiconductor die 1130 and the first adhesive layer 1120 are preferably sized relative to each other such that the peripheral edge of the first adhesive layer 1120 is substantially flush with and does not protrude beyond the side surface of the first semiconductor die 1130 which extends generally perpendicularly between the opposed, generally planar top and bottom surfaces thereof. The first semiconductor die 1130 may be formed of single crystal silicon, multi-crystal silicon, amorphous silicon, and equivalent materials thereto. The first semiconductor die 1130 is further preferably formed of a plurality of layers formed on a silicon substrate, a metal electrode for connecting the layers to an external environment, and a protective layer for protecting the metal electrode.

As is further seen in FIG. 1, the first semiconductor die 1130 further includes one or more bond pads 1131 disposed on the top surface thereof which is opposite the bottom surface contacting the adhesive layer 1120. The bond pads 1131 are preferably located in regions of the first semiconductor die 1130 where the metal electrode thereof is exposed to the outside environment. Though the bond pads 1131 are shown in FIG. 1 as projecting outwardly relative to the top surface of the first semiconductor die 1130, those of ordinary skill in the art will recognize that such bond pads 1131 may be substantially flush with or recessed relative to the top surface of the first semiconductor die 1130. The bond pads 1131 are preferably formed from material having good conductive properties, such as aluminum, copper, or equivalent materials.

In the semiconductor package 1100, each of the bond pads 1131 is electrically coupled or connected to a prescribed portion of the conductive pattern 1114 through the use of an elongate, first conductive wire 1140. As is shown in FIG. 1, one end of each first conductive wire 1140 may be ball-bonded to a respective one of the bond pads 1131, with the opposed end of such first conductive wire 1140 being electrically connected to the conductive pattern 1114 through the use of, for example, a stitch-bonding technique. In this regard, each first conductive wire 1140 may include a generally spherical ball bonding portion 1141 which is formed on a respective one of the bond pads 1131, and a stitch bonding portion 1142 which is formed on a prescribed portion of the conductive pattern 1114. As will be recognized by those of ordinary skill in the art, the first conductive wires 1140 electrically couple the bond pads 1131 and hence the first semiconductor die 1130 to the conductive pattern 1114, and hence the substrate 1110. Each conductive wire 1140 is preferably fabricated from a material having good electrical conductivity, such as aluminum, copper, gold, and equivalent materials thereto.

The semiconductor package 1100 further comprises a second adhesive layer 1150 which is applied to the top surface of the first semiconductor die 1130. The second adhesive layer 1150 is applied to a central portion of the top surface of the first semiconductor die 1130 in a prescribed thickness, and in spaced relation to the conductive wires 1140 and bond pads 1131. It is contemplated that the second adhesive layer 1150 will be formed from a material having a strong adhesive force, and may be an epoxy, adhesive tape, or an equivalent material thereto.

In the semiconductor package 1100, attached to the top surface of the second adhesive layer 1150 is a second semiconductor die 1160. The second semiconductor die 1160 defines a generally planar first (top) surface 1160*a*, and an opposed, generally planar second (bottom) surface 1160*b*. Formed on the first surface 1160*a* are one or more bond pads 1161. The bond pads 1161 are structurally and functionally identical to the above-described bond pads 1131 of the first semiconductor die 1130. Along these lines, like the first semiconductor die 1130 described above, the second semiconductor die 1160 may be formed of single crystal silicon, multi-crystal silicon, amorphous silicon, or equivalent materials thereto.

Though being structurally similar to the first semiconductor die 1130, the second semiconductor die 1160 further includes an insulative layer 1162 which is disposed on the second surface 1160*b* thereof. The insulative layer 1162 may comprise a film which includes a first (top) surface 1162*a*, and an opposed second (bottom) surface 1162*b*. The first surface 1162*a* is in contact with the second surface 1160*b* of the second semiconductor die 1160, with a portion of the second surface 1162*b* being attached to and in direct contact with the second adhesive layer 1150.

In accordance with the present invention, it is contemplated that the insulative layer 1162, rather than comprising a separate film, may alternatively be formed as an integral portion of the second semiconductor die 1160. If formed as an integral portion of the second semiconductor die 1160, the insulative layer 1162 may be formed to be of a suitable thickness, and may comprise a silicon oxide, a silicon nitride, or combinations thereof. Silicon oxide and silicon nitride each have excellent insulating properties, compared to pure silicon. In this regard, whereas pure silicon has an electrical resistivity of up to twenty ohms per centimeter, the electrical resistivity of silicon oxide and silicon nitride is greater than $10^{13}$ ohms per centimeter. Accordingly, the insulative layer 1162 effectively insulates the second semiconductor die 1160 from the first semiconductor die 1130, and further prevents the first semiconductor die 1130 and the second semiconductor die 1160 from being electrically short-cut or being leaked in current. Further, the material of the insulative layer 1162 has substantially the same physical properties as the silicon material of the second semiconductor die 1160. As a result, the insulative layer 1162 suppresses delamination caused by stresses due to the difference in thermal expansion coefficients. Also, manufacturing time for the semiconductor package 1100 may be reduced since adhesion and curing times of conventional insulative films is not required.

As indicated above, the insulative layer 1162 is preferably formed in a prescribed thickness on the second surface 1160*b* of the second semiconductor die 1160. More particularly, the thickness of the insulative layer 1162 preferably falls within the range of from about 1.5 microns to about 2.5 microns. If the thickness of the insulative layer 1162 is less than about 1.5 microns, a tunneling effect could occur which may adversely affect the insulating property thereof. Additionally, if the thickness of the insulative layer 1162 exceeds about 2.5 microns, a long manufacturing time is required for forming the insulative layer 1162.

Similar to the above-described manner in which the first semiconductor die 1130 is electrically connected to the conductive pattern 1114 through the use of the first conductive wires 1140, the second semiconductor die 1160 is also electrically connected to prescribed portions of the conductive pattern 1114 through the use of second conductive wires 1170. As seen in FIG. 1, one end of each second conductive wire 1170 is ball-bonded to a respective one of the bond pads 1161 of the second semiconductor die 1160, with the other end of such second conductive wire 1170 being stitch-bonded to a prescribed portion of the conductive pattern 1114. In this regard, each second conductive wire 1170 may include a generally spherical ball bonding portion 1171 which is formed upon a respective one of the bond pads 1161, and a stitch-bonding portion 1172 which is formed on and electrically coupled to a prescribed portion of the conductive pattern 1114. Thus, as will be recognized by those of ordinary skill in the art, the second conductive wires 1170 electrically couple or connect the bond pads 1161 and hence the second semiconductor die 1160 to the conductive pattern 1114, and hence the substrate 1110. The second conductive wires 1170 are preferably fabricated from the same materials described above in relation to the first conductive wires 1140. Though not shown, it is further contemplated that one end of each second conductive wire 1170 may be stitch-bonded to a respective one of the bond pads 1161, with the opposed end of such second conductive wire 1170 being electrically connected to the conductive pattern 1114 through the use of a ball-bonding technique.

The semiconductor package 1100 further comprises a package body 1180 which is formed on the substrate 1110 so as to effectively cover or encapsulate the first and second semiconductor dies 1130, 1160, the first and second conductive wires 1140, 1170, and the first and second adhesive layers 1120, 1150. The package body 1180 also covers the exposed portions of the conductive pattern 1114, and the exposed portion of the second surface 1111b of the insulative layer 1111. The package body 1180 is further preferably formed such that the side surface thereof, which extends generally perpendicularly between the generally planar top surface thereof, is substantially flush or continuous with the peripheral side surface of the insulative layer 1111 of the substrate 1110, as well as the peripheral edge of the solder mask 1115 applied to the first surface 1111a of the insulative layer 1111. As will be recognized by those of ordinary skill in the art, the package body 1180 effectively protects the internal elements of the semiconductor package 1100 described above from the external environment. The package body 1180 may be fabricated from a conventional epoxy resin, silicon resin, or an equivalent material thereto.

Referring now to FIGS. 6A-6J, there is shown an exemplary sequence of steps which may be used to facilitate the fabrication of the semiconductor package 1100 shown in FIG. 1. In the initial step of the fabrication process shown in FIG. 6A, the substrate 1110 is prepared. In preparing the substrate 1110, the insulative layer 1111 is initially provided. A metal layer is then formed to cover the totality of the first surface 1111a of the insulative layer 1111, with the lands 1112 then being patterned using a photolithography process. Via holes are then made using the photolithography process again, with the metal then being injected into each of the via holes. After the via holes are filled with the metal, such via holes are subject to a CMP process to facilitate the formation of the vias 1113. Thereafter, a metal layer is formed to cover the entirety of the second surface 1111b of the insulative layer 1111. Such metal layer is also patterned using a photolithography process to form the electrically conductive pattern 1114. Thereafter, the first surface 1111a of the insulative layer 1111 is coated with a polymer resin which is patterned to form the solder mask 1115. As previously explained, the fully formed vias 1113 place the lands 1112 into electrical communication with the conductive pattern 1114 in a prescribed pattern or arrangement.

Figure 6A:
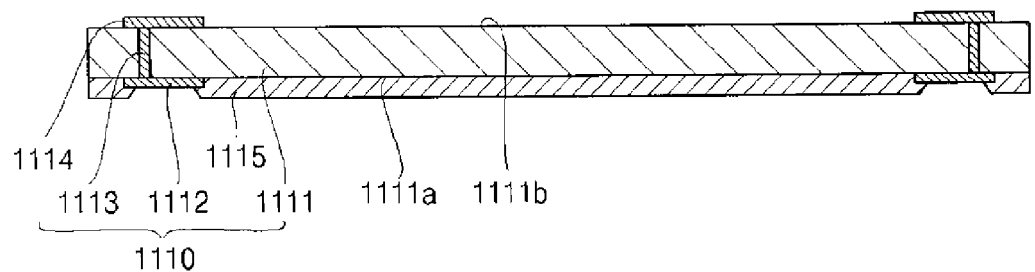
FIGS. 6A-6J illustrate an exemplary sequence of steps which may be used to facilitate the fabrication of the semiconductor package of the first embodiment shown in FIG. 1.
Figure 6B:
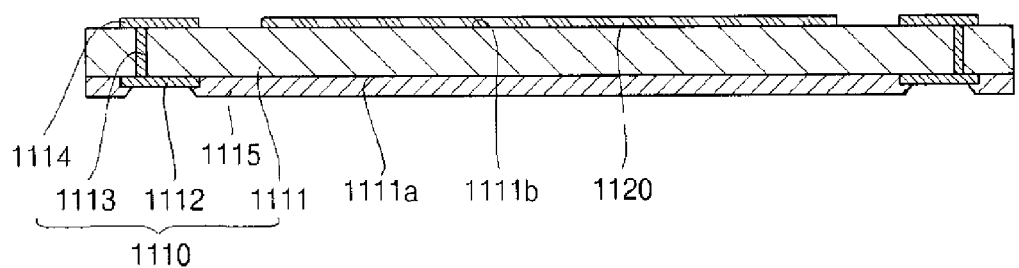

In the next step of the fabrication process shown in FIG. 6B, the first adhesive layer 1120 is applied or attached to a prescribed portion of the second surface 1111b of the insulative layer 1111. The first adhesive layer 1120 is generally in the shape of a film, though the present invention is not limited to any particular shape or material for the first adhesive layer 1120. As indicated above, the first adhesive layer 1120 may be an epoxy, an adhesive tape, or an equivalent material thereto.

Figure 6C:
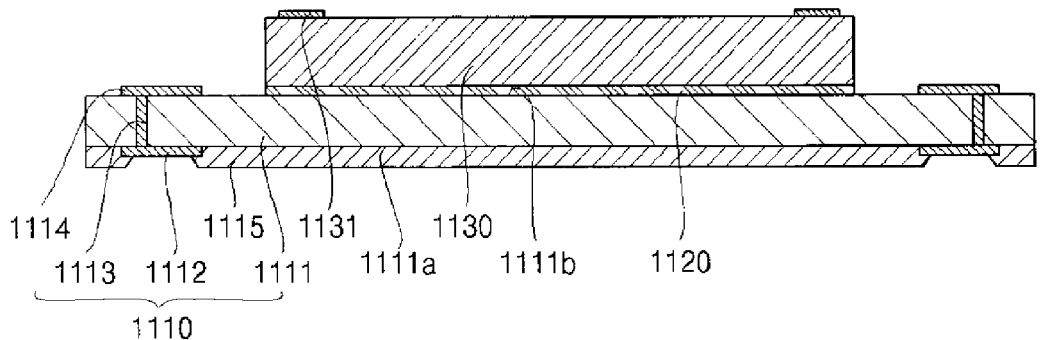

In the next step of the fabrication process for the semiconductor package 1100 shown in FIG. 6C, the first semiconductor die 1130 is attached to the top surface of the first adhesive layer 1120. More particularly, the bottom surface of this first semiconductor die 1130, which is opposite the top surface having the bond pads 1131 formed thereon, is that surface which is placed into direct contact with the first adhesive layer 1120.

Figure 6D:
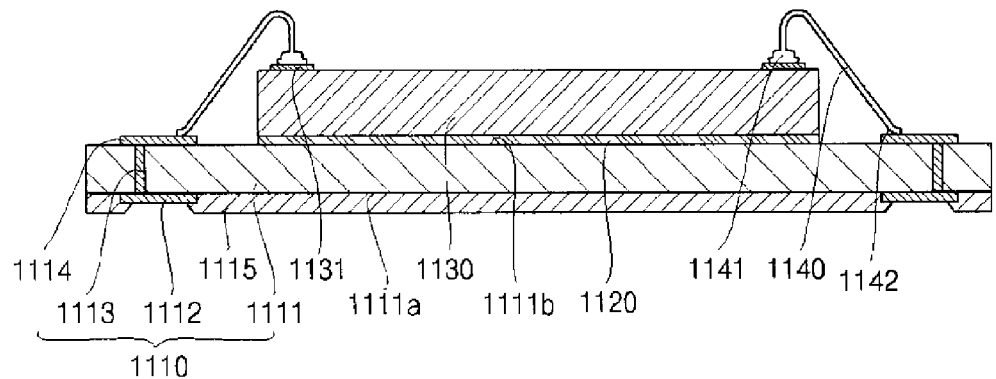

In the next step of the fabrication process shown in FIG. 6D, the first conductive wires 1140 are used to electrically connect the bond pads 1131 of the first semiconductor die 1130 to the conductive pattern 1114 of the substrate 1110. As previously explained, one end of each first conductive wire 1140 forms a ball bonding portion 1141 on a respective one of the bond pads 1131, with the remaining end of each of the first conductive wires 1140 forming a stitch-bonding portion 1142 on a prescribed portion of the conductive pattern 1114. Each of the conductive wires 1140 is preferably formed through the use of a capillary, and may be formed in a forward folded loop mode. Though not shown, it is contemplated that each first conductive wire 1140 may alternatively be formed in a reverse loop mode. More particularly, one end of each of the first conductive wires 1140 may form a ball bonding portion on a prescribed portion of the conductive pattern 1114, with the other end of each such first conductive wire 1140 forming a stitch-bonding portion on a respective one of the bond pads 1131, such reverse loop mode first conductive wires 1140 also being formed through the use of a capillary.

Figure 6E:
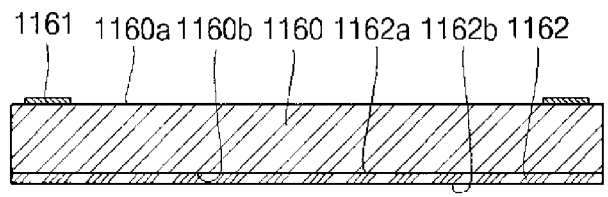

In the next step of the fabrication process shown in FIG. 6E, the second semiconductor die 1160 is provided. As indicated above, the second semiconductor die 1160 includes the bond pads 1161 formed on the first surface 1160a thereof, and the insulative layer 1162 which is formed on the second surface 1162b thereof. As previously explained, the insulative layer 1162 may be a silicon oxide, or may be formed into a silicon nitride instead of a silicon oxide by employing a plasma method or CVD/PVD. The insulative layer 1162 may also be formed using a thermal process in a wafer fabrication or assembly process. Moreover, the insulative layer 1162 may also be formed in a wafer back grinding process of the assembly process.

If the insulative layer 1162 is formed in a wafer back grinding process, such insulative layer 1162 may be formed by controlling a cooling condition in the wafer back grinding process of the assembly process. More particularly, the insulative layer 1162 may be formed by stopping the cooling in the wafer back grinding process and controlling a grinding rate. At this time, the cooling temperature may range from about 250° C. to about 350° C. to stop the cooling. If the cooling temperature is less than about 250° C., the grinding rate is increased, and therefore it is difficult to be controlled at a suitable grinding rate. Also, a cooling temperature exceeding about 350° C. makes the grinding time excessively long. As indicated above, the insulative layer 1162 is preferably formed to be of a thickness in the range of about 1.5 microns to about 2.5 microns. Forming the insulative layer 1162 within this particular thickness range concurrently addresses the considerations of the insulation function thereof while minimizing the thickness of semiconductor package 1100. Though called out as a separate step in relation to FIG. 6E, those of ordinary skill in the art will recognize that the step of providing the second semiconductor die 1160 may be conducted concurrently with any of the prior steps shown in relation to FIGS. 6A-6D.

Figure 6F:
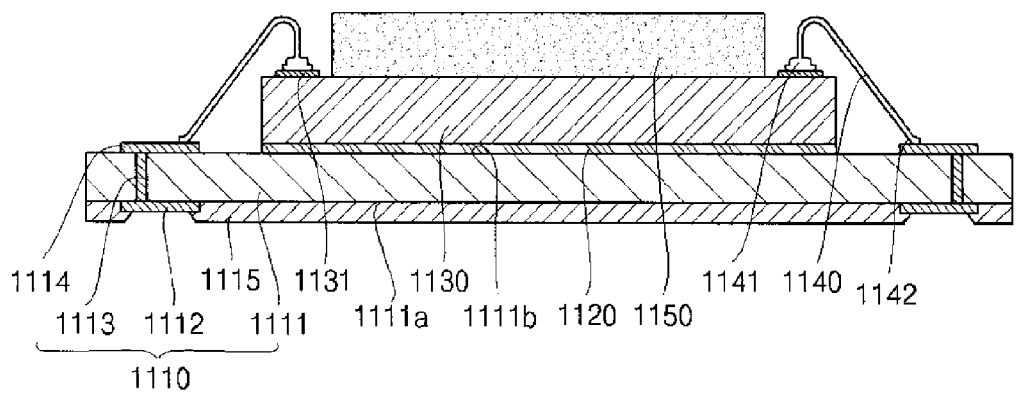

In the next step of the fabrication process for the semiconductor package 1100 shown in FIG. 6F, the second adhesive layer 1150 is applied or attached to the top surface of the first semiconductor die 1130. As shown in FIG. 6F, the second adhesive layer 1150 is preferably formed to be of a thickness which causes the height thereof in a vertical direction as viewed from the perspective shown in FIG. 6F to slightly exceed the maximum vertical height of each of the first conductive wires 1140 used to electrically connect the first semiconductor die 1130 to the substrate 1110. As indicated above, the second adhesive layer 1150 may be an epoxy, an adhesive tape, or an equivalent material thereto.

Figure 6G:
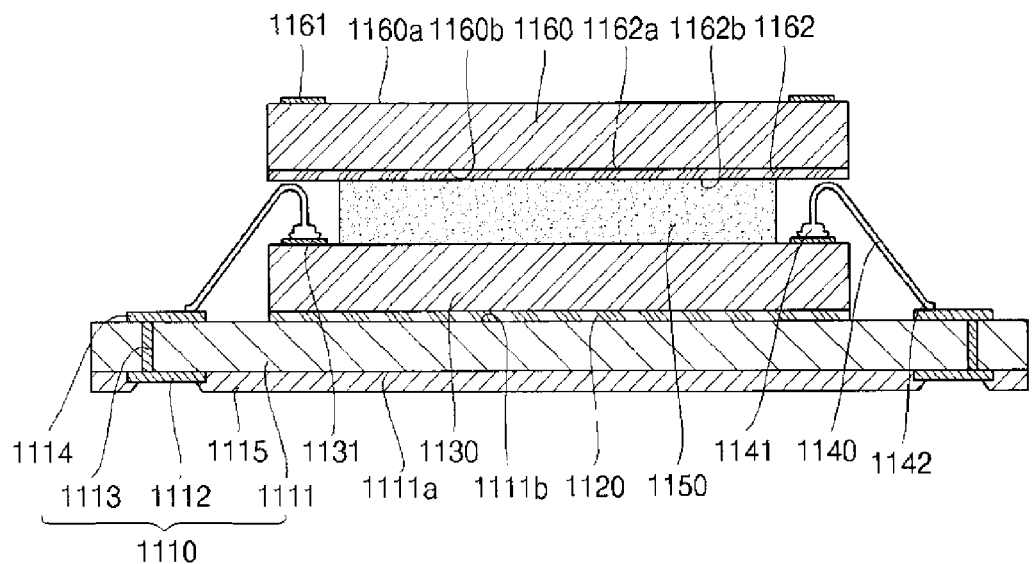

In the next step of the fabrication process shown in FIG. 6G, the second semiconductor die 1160 is attached to the second adhesive layer 1150. More particularly, the insulative layer 1162 of the second semiconductor die 1160 is attached to the second adhesive layer 1150 in the manner shown in FIG. 6G. As a result, the second semiconductor die 1160 is electrically insulated from the first conductive wires 1140. As further shown in FIG. 6G, the size of the second semiconductor die 1160 is substantially the same as that of the first semiconductor die 1130, both of which exceed the size of the intervening second adhesive layer 1150. Thus, though the second semiconductor die 1160 effectively overhangs the second adhesive layer 1160 as well as portions of the first conductive wires 1140, the second semiconductor die 1160, and in particular the insulative layer 1162 thereof, does not contact the conductive wires 1140 due to the height of the second adhesive layer 1150 preferably slightly exceeding the maximum vertical height of the first conductive wires 1140 as described above.

Figure 6H:
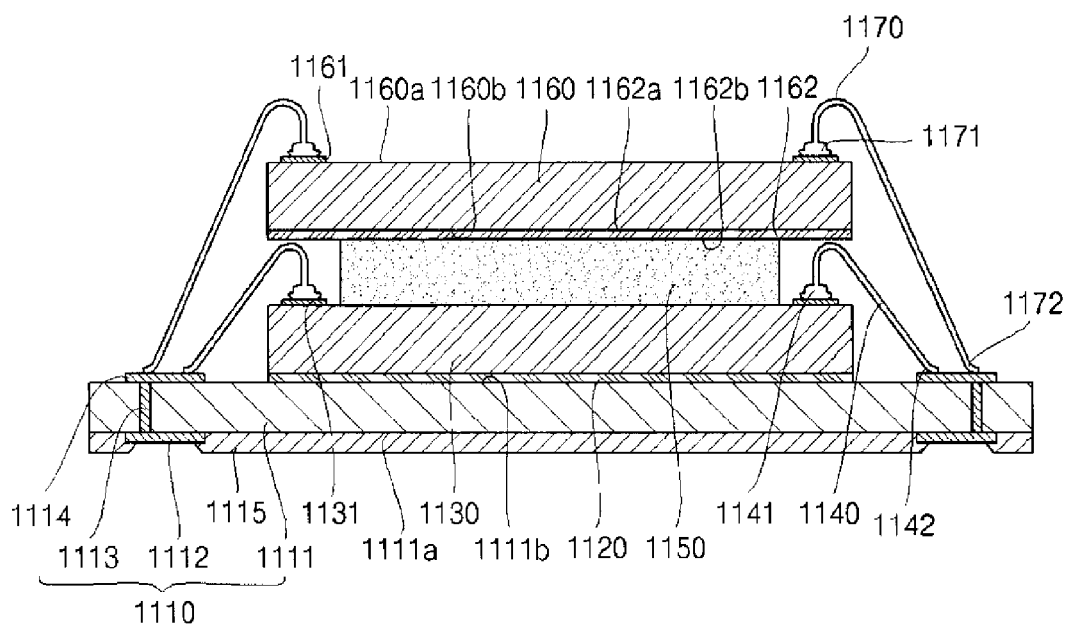

In the next step of the fabrication process shown in FIG. 6H, the second conductive wires 1170 are used to electrically connect the bond pads 1161 of the second semiconductor die 1160 to the conductive pattern 1114 and hence the substrate 1110. The second conductive wires 1170 may each be formed in accordance with the same options described above in relation to the first conductive wires 1140 shown in FIG. 6D.

Figure 6I:
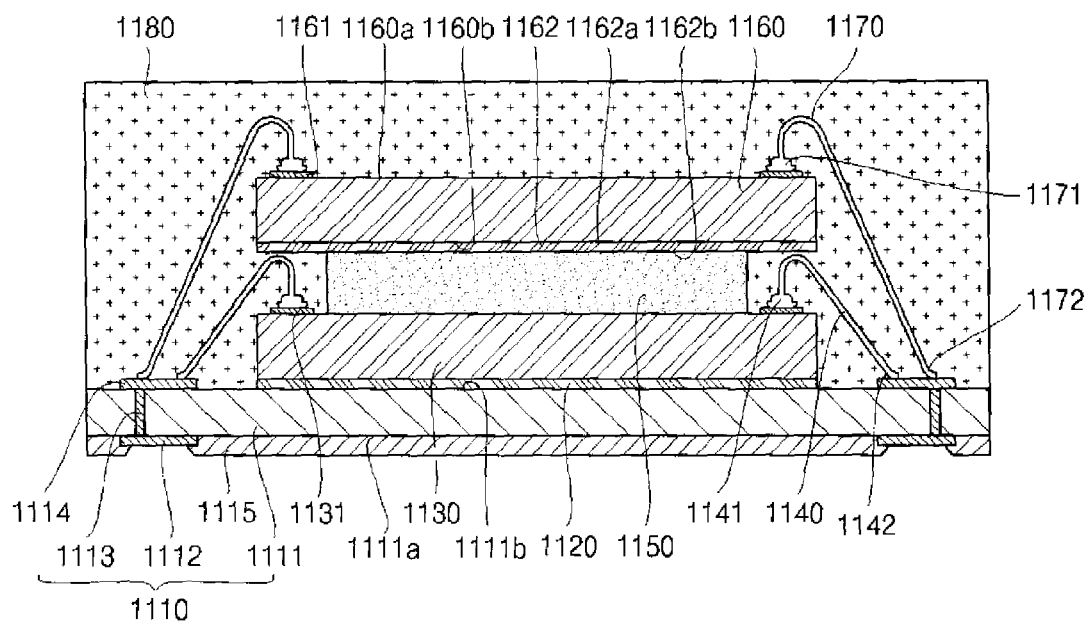

In the next step of the fabrication process shown in FIG. 6I, the package body 1180 is formed on the top surface of the substrate 1110 so as to cover the first and second semiconductor dies 1130, 1160, the first and second conductive wires 1140, 1170, and the first and second adhesive layers 1120, 1150 in the above-described manner. It is contemplated that the package body 1180 may be formed by injecting one of the above-described materials in a liquid state into a suitable mold.

Figure 6J:
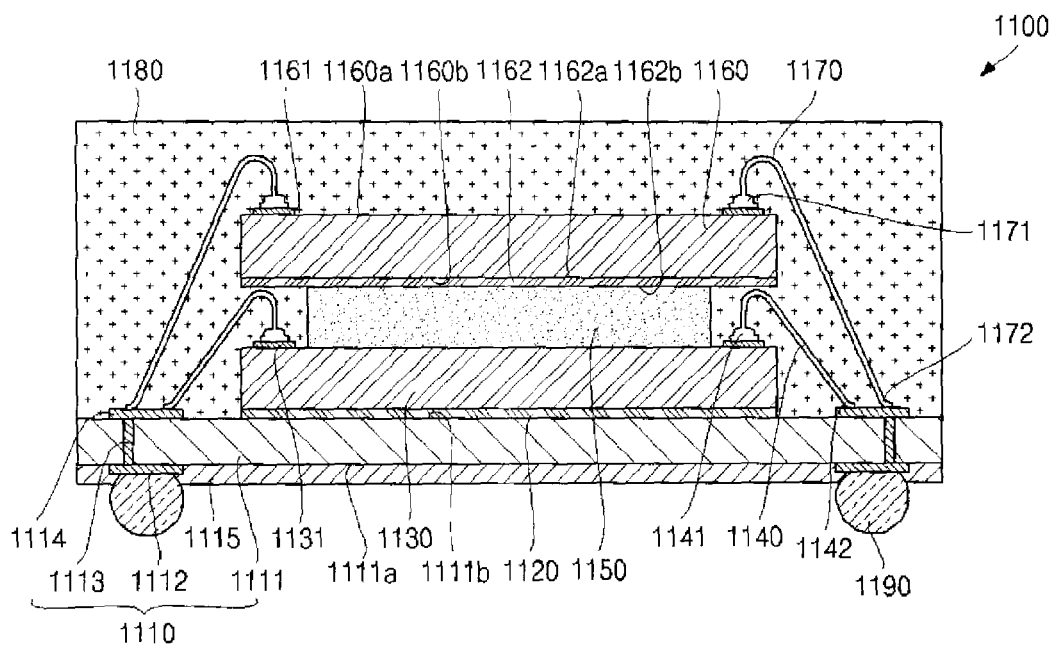

In the last step of the fabrication process for the semiconductor package 1100 as shown in FIG. 6J, the solder balls 1190 are mounted and electrically connected to the exposed portions of respective ones of the lands 1112 of the substrate 1110. In this regard, it is contemplated that each of the solder balls 1190 may be formed through the use of a reflowing and subsequent cooling procedure known by those of ordinary skill in the art. The solder balls 1190 are each preferably spherically configured, and may be fabricated from tin, lead and/or silver that is easy to produce and handle, and has a low melting point.

Figure 2:
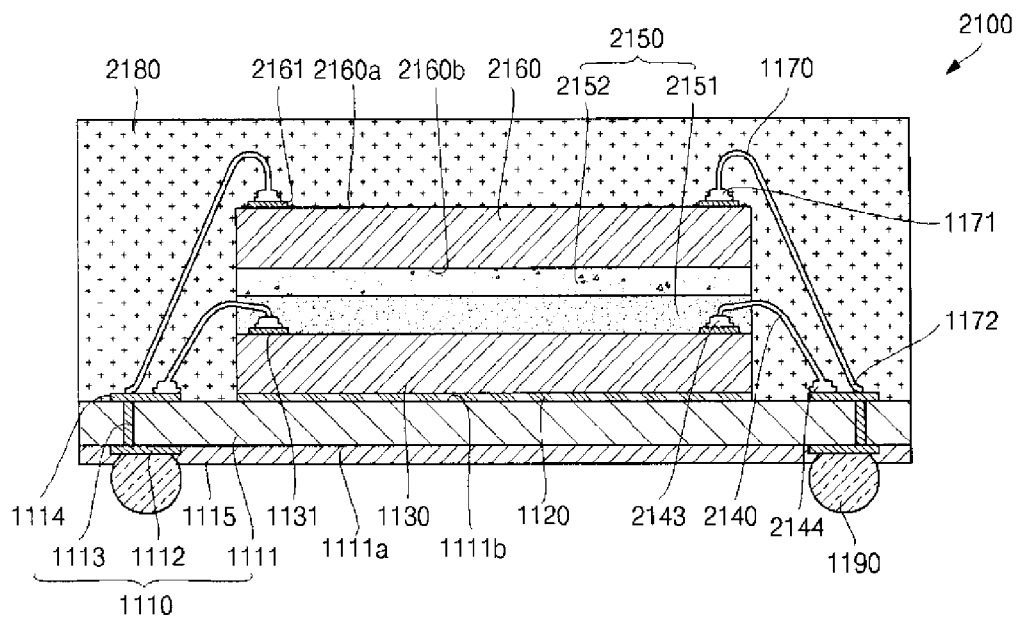
FIG. 2 is a cross-sectional view of a semiconductor package constructed in accordance with a second embodiment of the present invention.

FIG. 2 illustrates a semiconductor package 2100 constructed in accordance with a second embodiment of the present invention. The semiconductor package 2100 comprises a substrate 1110 which functions to transmit electrical signals to and from the semiconductor package 2100. The substrate 1110 comprises a thin, plate-like insulative layer 1111 which defines a generally planar first (bottom) surface 1111a and an opposed, generally planar second (top) surface 1111b. The insulative layer 1111 further comprises a third (side) surface which extends generally perpendicularly between the first and second surfaces 1111a, 1111b. The insulative layer 1111 may comprise a base film formed from a thermosetting resin, a polymer, polyimide, or an equivalent material.

The substrate 1110 further comprises one or more electrically conductive lands 1112 which are formed on the first surface 1111a in a prescribed pattern or arrangement. Each of the lands 1112 preferably has a generally circular configuration, though different shapes for the lands 1112 are contemplated to be within the spirit and scope of the present invention. The substrate 1110 also includes an electrically conductive pattern 1114 which is formed on the second surface 1111b. The conductive pattern 1114 may comprise various pads, traces, or combinations thereof. In the substrate 1110, the lands 1112 and the conductive pattern 1114 are electrically connected to each other in a prescribed pattern or arrangement through the use of conductive vias 1113 which extend through the insulative layer 1111 between the first and second surfaces 1111a, 1111b thereof in the manner shown in FIG. 2. In the semiconductor package 2100, it is contemplated that the lands 1112, vias 1113 and conductive pattern 1114 will each be formed from copper or a suitable equivalent material having good electrical conductivity. With particular regard to the vias 1113, it is further contemplated that such vias 1113 may be formed by coating the walls of cylindrical apertures extending through the insulative layer 1111 with a conductive metal film as places the lands 1112 into electrical communication with the conductive pattern 1114 in a prescribed manner.

The substrate 1110 further preferably includes a solder mask 1115 which is formed on the first surface 1111a of the insulative layer 1111. As seen in FIG. 2, the solder mask 1115 is formed to surround and cover a predetermined region of the periphery of each of the lands 1112. Additionally, as is also seen in FIG. 2, it is contemplated that in the substrate 1110, solder balls 1190 will be electrically coupled to respective ones of the lands 1112, such solder balls 1190 being used to transmit electrical signals from the semiconductor package 2100 to an external device. The solder mask 1115, which contacts each of the solder balls 1190, electrically insulates each of the solder balls 1190 from the adjacent lands 1112 on which other solder balls 1190 are formed. The solder mask 1115 is preferably fabricated from a material having a good insulating property, such as benzocyclobutene (BCB) resin, polyimide, and equivalent materials.

The semiconductor package 2100 further comprises a first adhesive layer 1120 which is applied to a central portion of the second surface 1111b of the insulative layer 1111. The first adhesive layer 1120 is preferably formed to be of a prescribed thickness, and is disposed in spaced relation to the conductive pattern 1114 disposed on the second surface 1111b. The first adhesive layer 1120 preferably has a strong viscosity, and may comprise an epoxy, adhesive tape, or an equivalent material, the present invention not being limited to any particular material for the first adhesive layer 1120.

The semiconductor package 2100 further comprises a first semiconductor die 1130 which is attached to the substrate 1110, and in particular to the first adhesive layer 1120 in the manner shown in FIG. 2. In this regard, the first semiconductor die 1130 and the first adhesive layer 1120 are preferably sized relative to each other such that the peripheral edge of the first adhesive layer 1120 is substantially flush with and does not protrude beyond the side surface of the first semiconductor die 1130 which extends generally perpendicularly between the opposed, generally planar top and bottom surfaces thereof. The first semiconductor die 1130 may be formed of single crystal silicon, multi-crystal silicon, amorphous silicon, and equivalent materials thereto. The first semiconductor die 1130 is further preferably formed of a plurality of layers formed on a silicon substrate, a metal electrode for connecting the layers to an external environment, and a protective layer for protecting the metal electrode.

As is further seen in FIG. 2, the first semiconductor die 1130 further includes one or more bond pads 1131 disposed on the top surface thereof which is opposite the bottom surface contacting the adhesive layer 1120. The bond pads 1131 are preferably located in regions of the first semiconductor die 1130 where the metal electrode thereof is exposed to the outside environment. Though the bond pads 1131 are shown in FIG. 2 as projecting outwardly relative to the top surface of the first semiconductor die 1130, those of ordinary skill in the art will recognize that such bond pads 1131 may be substantially flush with or recessed relative to the top surface of the first semiconductor die 1130. The bond pads 1131 are preferably formed from material having good conductive properties, such as aluminum, copper, or equivalent materials.

In the semiconductor package 2100, each of the bond pads 1131 is electrically coupled or connected to a prescribed portion of the conductive pattern 1114 through the use of an elongate, first conductive wire 2140. As is shown in FIG. 2, one end of each first conductive wire 2140 may be stitch-bonded to a respective one of the bond pads 1131, with the opposed end of such first conductive wire 2140 being electrically connected to the conductive pattern 1114 through the use of, for example, a ball-bonding technique. In this regard, one end of each first conductive wire 1140 may be stitch-bonded to a conductive stud bump 2143 which is formed on a respective one of the bond pads 1131, with the opposed end being ball-bonded to a prescribed portion of the conductive pattern 1114 to form a spherically shaped ball bonding portion 2144. As will be recognized by those of ordinary skill in the art, the first conductive wires 2140 electrically couple the bond pads 1131 and hence the first semiconductor die 1130 to the conductive pattern 1114, and hence the substrate 1110. Each conductive wire 2140 is preferably fabricated from a material having good electrical conductivity, such as aluminum, copper, gold, and equivalent materials thereto. Though not shown, it is further contemplated that one end of each first conductive wire 2140 may be ball-bonded to a respective one of the bond pads 1131, with the opposed end of such first conductive wire 2140 being electrically connected to the conductive pattern 1114 through the use of a stitch-bonding technique.

The semiconductor package 2100 further comprises a flow layer 2150 which is applied to the top surface of the first semiconductor die 1130. The flow layer 2150 is applied to a central portion of the top surface of the first semiconductor die 1130 in a prescribed thickness. In the semiconductor package 2100, the flow layer 2150 preferably comprises a high flow layer 2151 which is formed on the top surface of the first semiconductor die 1130, and a low flow layer 2152 which is formed on the high flow layer 2151. As seen in FIG. 2, the high flow layer 2151 is formed on the first semiconductor die 1130 so as to cover or encapsulate the bond pads 1131, the stud bumps 2143, and portions of each of the first conductive wires 2140 electrically connected to the bond pads 1131 and stud bumps 2143. Thus, the first conductive wires 2140 protrude from the high flow layer 2151 in the manner shown in FIG. 2. The viscosity of the high flow layer 2151 preferably falls within the range of from about 5,000 poise to about 13,500 poise. If the viscosity of the high flow layer 2151 is less than about 5,000 poise, it is difficult for the high flow layer 2151 to maintain its shape since it has a high mobility. Additionally, if the viscosity of the high flow layer 2151 exceeds about 13,500 poise, it is difficult to have such high flow layer 2151 properly encapsulate the above-described elements, due to the risk of forming an undesirable gap between such elements and the high flow layer 2151. The high flow layer 2151 further preferably covers the exposed portions of the top surface of the first semiconductor die 1130, and extends to a substantially flush relationship with the side surface thereof.

As indicated above, the flow layer 2150 further includes a low flow layer 2152 which is formed on the high flow layer 2151. The low flow layer 2152 preferably has a higher viscosity than that of the high flow layer 2151. The viscosity of the low flow layer 2152 is preferably in the range of from about 13,500 poise to about 50,000 poise. If the viscosity of the low flow layer 2152 is less than about 13,500 poise, it is difficult for the low flow layer 2152 to be attached to the bottom surface of the second semiconductor die 2160 of the semiconductor package 2100 which will be described in more detail below. Additionally, if the viscosity of the low flow layer 2152 exceeds about 50,000 poise, it is difficult for the low flow layer 2152 to be maintained in a desired shape. As will also be discussed in more detail below, it is typically necessary to saw the flow layer 2150 to cause the same to assume a prescribed shape. However, if the viscosity of the low flow layer 2152 exceeds about 50,000 poise, such sawing process is exceedingly difficult to properly implement.

In the semiconductor package 2100, attached to the top surface of the flow layer 2150 is the second semiconductor die 2160 mentioned above. More particularly, the second semiconductor die 2160 is attached to the low flow layer 2152 of the flow layer 2150. The second semiconductor die 1160 defines a generally planar first (top) surface 2160a, and an opposed, generally planar second (bottom) surface 2160b. Formed on the first surface 2160a are one or more bond pads 2161. The bond pads 2161 are structurally and functionally identical to the above-described bond pads 1131 of the first semiconductor die 1130. Along these lines, like the first semiconductor die 1130 described above, the second semiconductor die 2160 may be formed of single crystal silicon, multi-crystal silicon, amorphous silicon, or equivalent materials thereto.

Similar to the above-described manner in which the first semiconductor die 1130 is electrically connected to the conductive pattern 1114 through the use of the first conductive wires 2140, the second semiconductor die 2160 is also electrically connected to prescribed portions of the conductive pattern 1114 through the use of second conductive wires 1170. As seen in FIG. 2, one end of each second conductive wire 1170 may be ball-bonded to a respective one of the bond pads 2161 of the second semiconductor die 1160, with the other end of such second conductive wire 1170 being stitch-bonded to a prescribed portion of the conductive pattern 1114. In this regard, each second conductive wire 1170 may include a generally spherical ball bonding portion 1171 which is formed upon a respective one of the bond pads 1161, and a stitch-bonding portion 1172 which is formed on and electrically coupled to a prescribed portion of the conductive pattern 1114. Thus, as will be recognized by those of ordinary skill in the art, the second conductive wires 1170 electrically couple or connect the bond pads 1161 and hence the second semiconductor die 1160 to the conductive pattern 1114, and hence the substrate 1110. The second conductive wires 1170 are preferably fabricated from the same materials described above in relation to the first conductive wires 1140. Though not shown, it is further contemplated that one end of each second conductive wire 1170 may be stitch-bonded to a respective one of the bond pads 2161, with the opposed end of such second conductive wire 1170 being electrically connected to the conductive pattern 1114 through the use of a ball-bonding technique.

The semiconductor package 2100 further comprises a package body 1180 which is formed on the substrate 1110 so as to effectively cover or encapsulate the first and second semiconductor dies 1130, 2160, the first and second conductive wires 2140, 1170, and the flow layer 2150. The package body 1180 also covers the exposed portions of the conductive pattern 1114, and the exposed portion of the second surface 1111*b* of the insulative layer 1111. The package body 1180 is further preferably formed such that the side surface thereof, which extends generally perpendicularly between the generally planar top surface thereof, is substantially flush or continuous with the peripheral side surface of the insulative layer 1111 of the substrate 1110, as well as the peripheral edge of the solder mask 1115 applied to the first surface 1111*a* of the insulative layer 1111. As will be recognized by those of ordinary skill in the art, the package body 1180 effectively protects the internal elements of the semiconductor package 2100 described above from the external environment. The package body 1180 may be fabricated from a conventional epoxy resin, silicon resin, or an equivalent material thereto.

Referring now to FIGS. 7A-7J, there is shown an exemplary sequence of steps which may be used to facilitate the fabrication of the semiconductor package 2100 shown in FIG. 2. In the initial step of the fabrication process shown in FIG. 7A, the substrate 1110 is prepared in the same manner described above in relation to FIG. 6A.

Figure 7A:
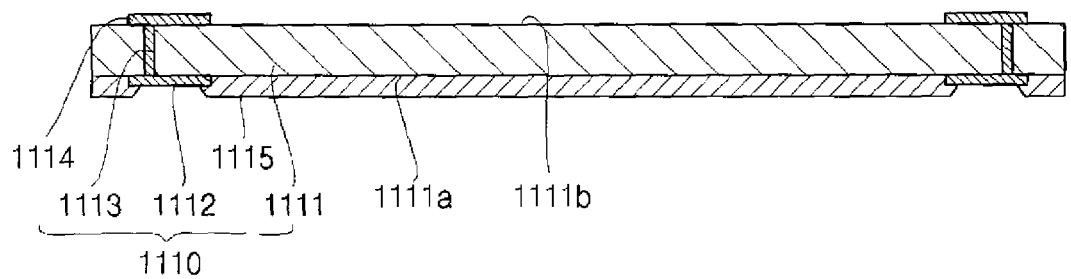
FIGS. 7A-7J illustrate an exemplary sequence of steps which may be used to facilitate the fabrication of the semiconductor package of the second embodiment shown in FIG. 2.
Figure 7B:
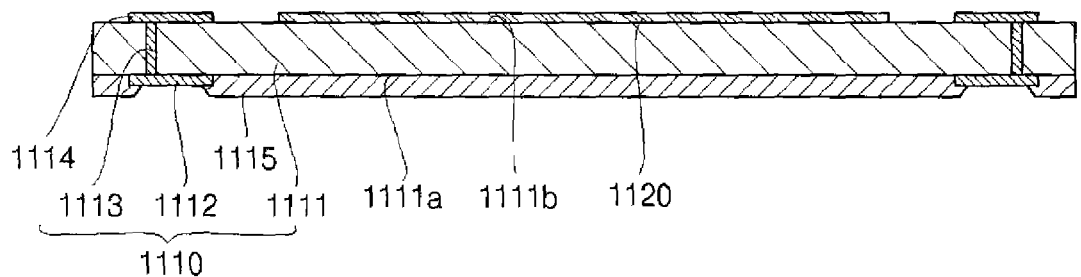

In the next step of the fabrication process shown in FIG. 7B, the first adhesive layer 1120 is applied or attached to a prescribed portion of the second surface 1111*b* of the insulative layer 1111. The first adhesive layer 1120 is generally in the shape of a film, though the present invention is not limited to any particular shape or material for the first adhesive layer 1120. As indicated above, the first adhesive layer 1120 may be an epoxy, an adhesive tape, or an equivalent material thereto.

Figure 7C:
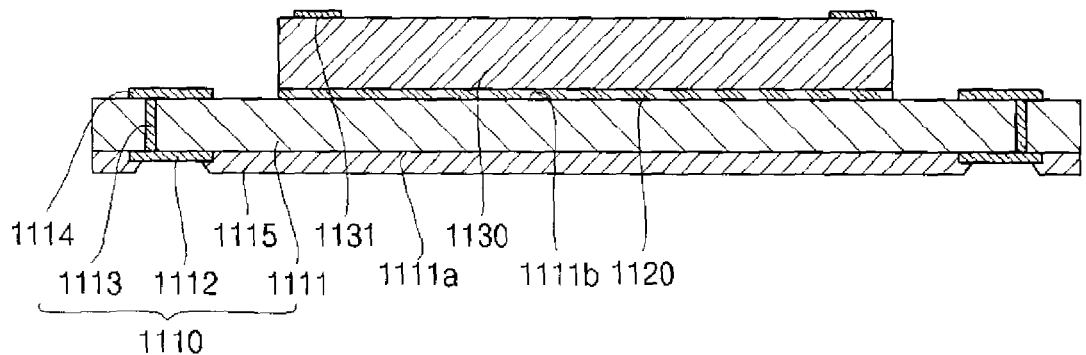

In the next step of the fabrication process for the semiconductor package 2100 shown in FIG. 7C, the first semiconductor die 1130 is attached to the top surface of the first adhesive layer 1120. More particularly, the bottom surface of this first semiconductor die 1130, which is opposite the top surface having the bond pads 1131 formed thereon, is that surface which is placed into direct contact with the first adhesive layer 1120.

Figure 7D:
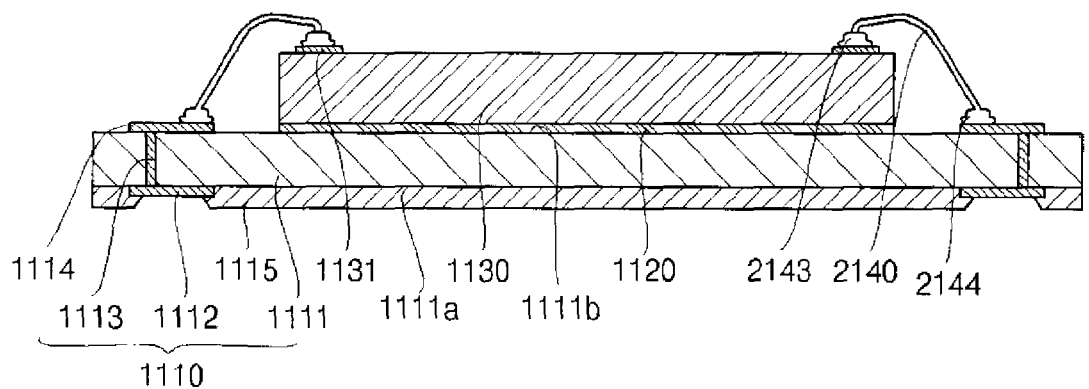

In the next step of the fabrication process shown in FIG. 7D, the first conductive wires 2140 are used to electrically connect the bond pads 1131 of the first semiconductor die 1130 to the conductive pattern 1114 of the substrate 1110. As previously explained, one end of each first conductive wire 2140 is stitch-bonded to a corresponding stud bump 2143 formed on a respective one of the bond pads 1131, with the remaining end of each of the first conductive wires 2140 forming a ball-bonding portion 2144 on a prescribed portion of the conductive pattern 1114. Each of the conductive wires 1140 is preferably formed through the use of a capillary, and may be formed in a reverse folded loop mode. Though not shown, it is contemplated that each first conductive wire 2140 may alternatively be formed in a forward loop mode. More particularly, one end of each of the first conductive wires 2140 may form a stitch-bonding portion on a prescribed portion of the conductive pattern 1114, with the other end of each such first conductive wire 2140 forming a ball-bonding portion on a respective one of the bond pads 1131, such forward loop mode first conductive wires 2140 also being formed through the use of a capillary.

Figure 7E:
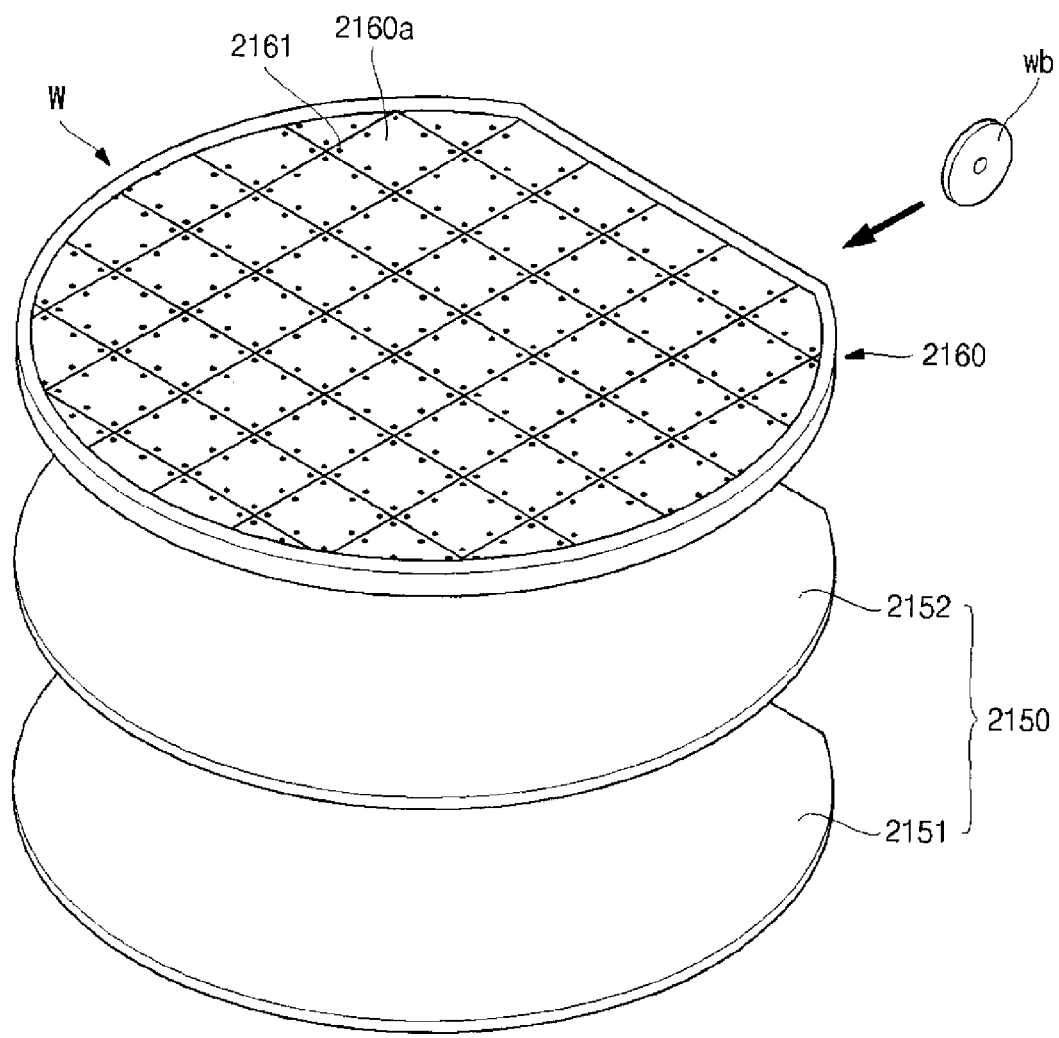
Figure 7F:
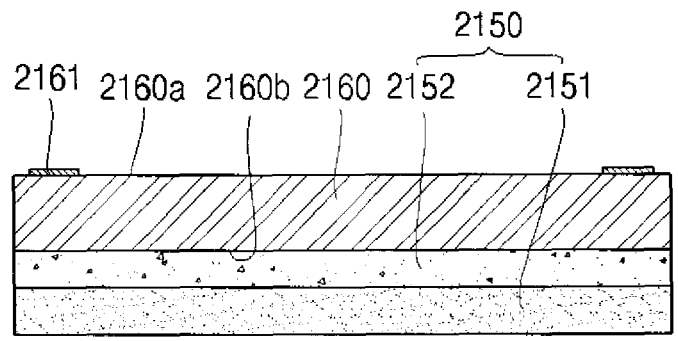

In the next step of the fabrication process shown in FIGS. 7E and 7F, the second semiconductor die 2160 is provided. Initially, a plurality of the second semiconductor dies 2160 are provided in a single wafer, such semiconductor dies 2160 being integrally connected to each other within the wafer. The high flow layer 2151 and the low flow layer 2152 are then successively applied to a common surface of such wafer. The high flow and low flow layers 2151, 2152 are preferably formed from materials having the viscosity ranges highlighted above, and may each be an adhesive in which silica or Teflon® is added to a resin. Subsequent to the application of the high flow and low flow layers 2151, 2152 thereto, the wafer is sawed independently using a diamond blade. As will be recognized, such saw singulation process effectively separates the wafer into the second semiconductor dies 2160, each of which includes a flow layer 2150 applied thereto. A semiconductor die 2160 as singulated from the wafer is shown in FIG. 7F. Though called out as a separate step in relation to FIGS. 7E and 7F, those of ordinary skill in the art will recognize that the step of providing the second semiconductor die 2160 may be conducted concurrently with any of the prior steps shown in relation to FIGS. 7A-7D.

Figure 7G:
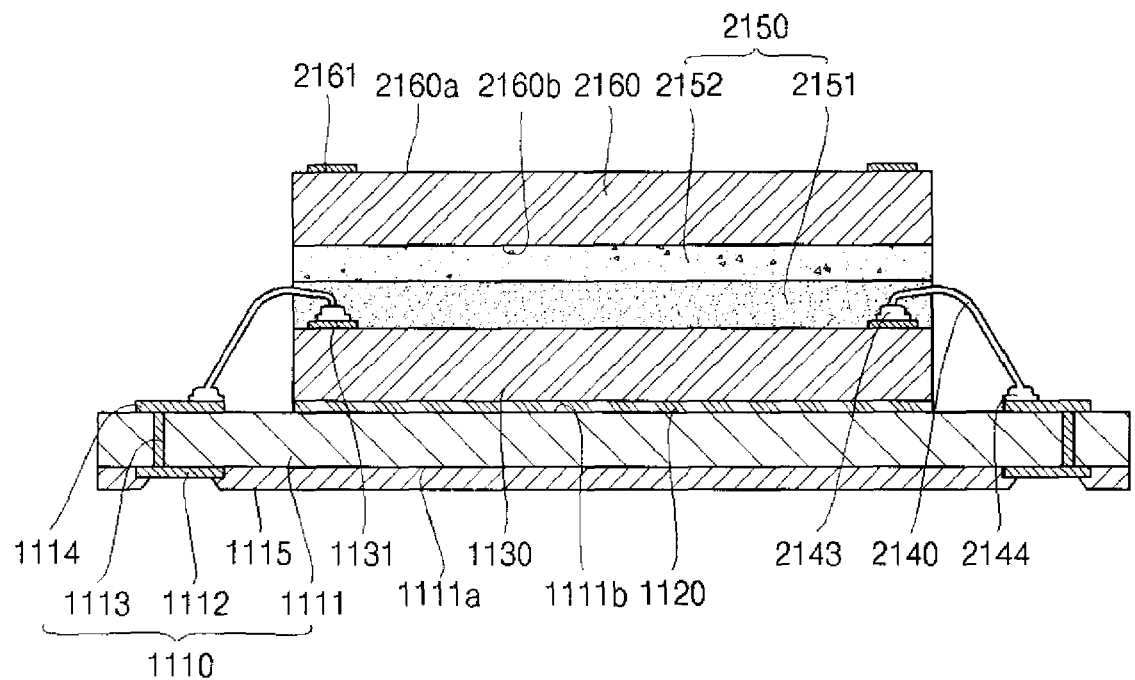

In the next step of the fabrication process shown in FIG. 7G, the second semiconductor die 2160, which includes the flow layer 2150, is attached to the top surface of the first semiconductor die 1130. More particularly, as explained above, the second semiconductor die 2160 is attached to the first semiconductor die 1130 such that the bond pads 1131, stud bumps 2143 and portions of the conductive wires 2140 are encapsulated by the high flow layer 2151 of the flow layer 2150 in the manner shown in FIG. 7G. As is further shown in FIG. 7G, the size of the second semiconductor die 2160 is substantially the same as that of the first semiconductor die 1130, with the side surfaces of the first and second semiconductor dies 1130, 2160 extending in generally co-planar relation to each other.

Figure 7H:
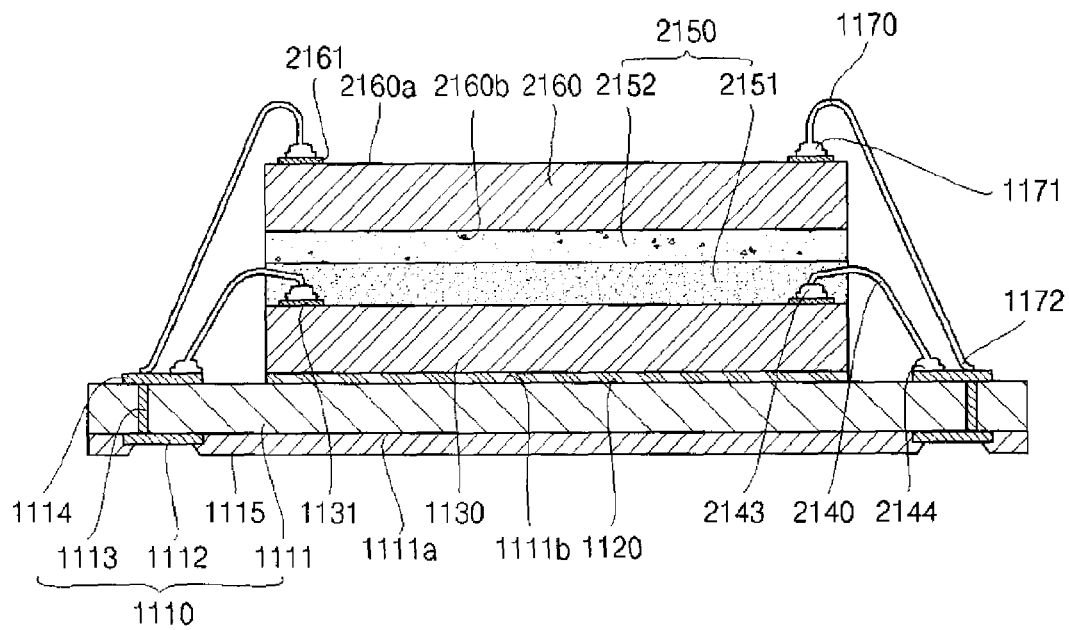

In the next step of the fabrication process shown in FIG. 7H, the second conductive wires 1170 are used to electrically connect the bond pads 2161 of the second semiconductor die 2160 to the conductive pattern 1114 and hence the substrate 1110. The second conductive wires 1170 may each be formed in accordance with the same options described above in relation to the first conductive wires 2140 shown in FIG. 7D.

Figure 7I:
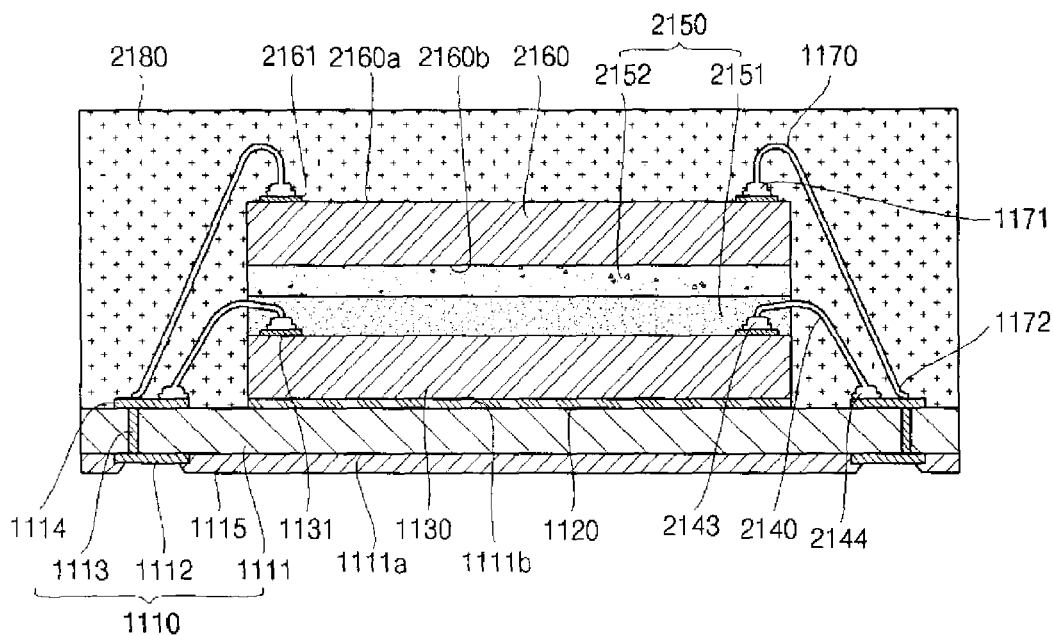

In the next step of the fabrication process shown in FIG. 7I, the package body 1180 is formed on the top surface of the substrate 1110 so as to cover the first and second semiconductor dies 1130, 2160, the first and second conductive wires 2140, 1170, and the flow layer 2150 in the above-described manner. It is contemplated that the package body 1180 may be formed by injecting one of the above-described materials in a liquid state into a suitable mold.

Figure 7J:
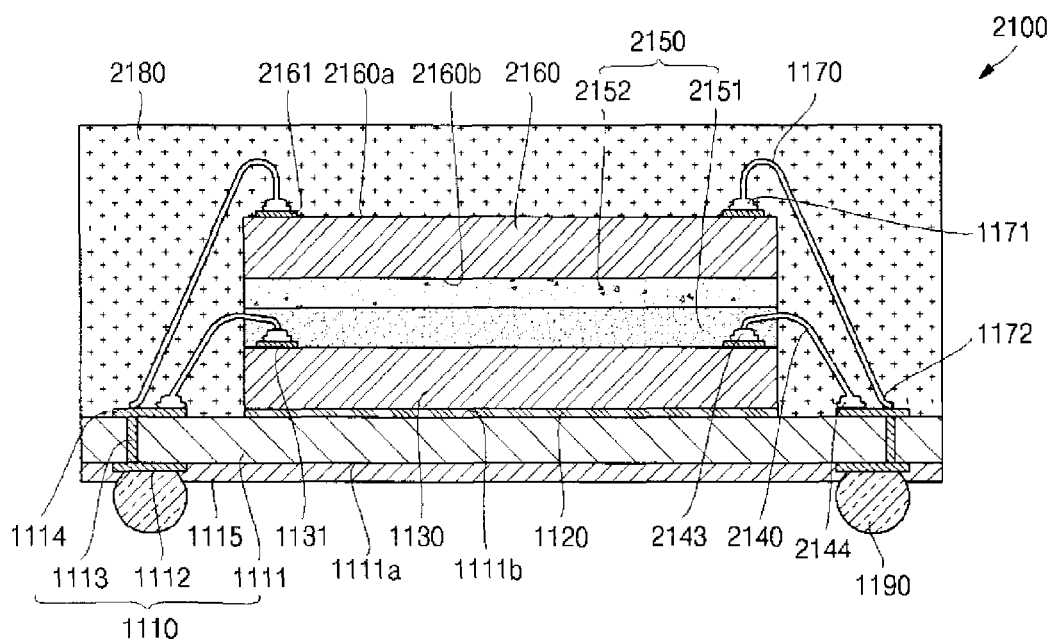

In the last step of the fabrication process for the semiconductor package 2100 as shown in FIG. 7J, the solder balls 1190 are mounted and electrically connected to the exposed portions of respective ones of the lands 1112 of the substrate 1110. In this regard, it is contemplated that each of the solder balls 1190 may be formed through the use of a reflowing and subsequent cooling procedure known by those of ordinary skill in the art. The solder balls 1190 are each preferably spherically configured, and may be fabricated from tin, lead and/or silver that is easy to produce and handle, and has a low melting point.

Figure 8A:
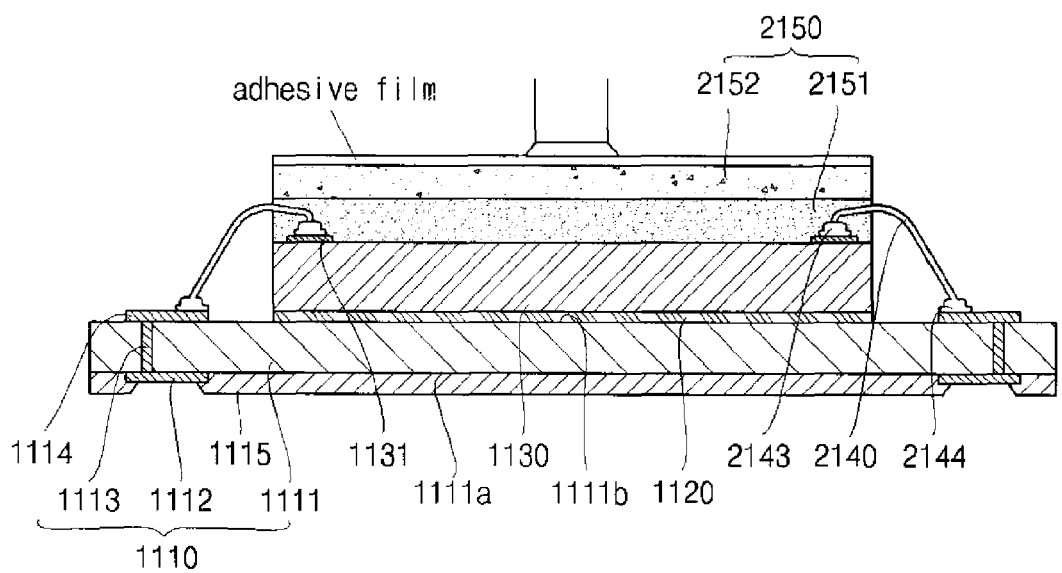
FIGS. 8A and 8B illustrate exemplary steps which may be employed as an alternative to certain steps shown in FIGS. 7A-7J to facilitate the fabrication of the semiconductor package of the second embodiment shown in FIG. 2.
Figure 8B:
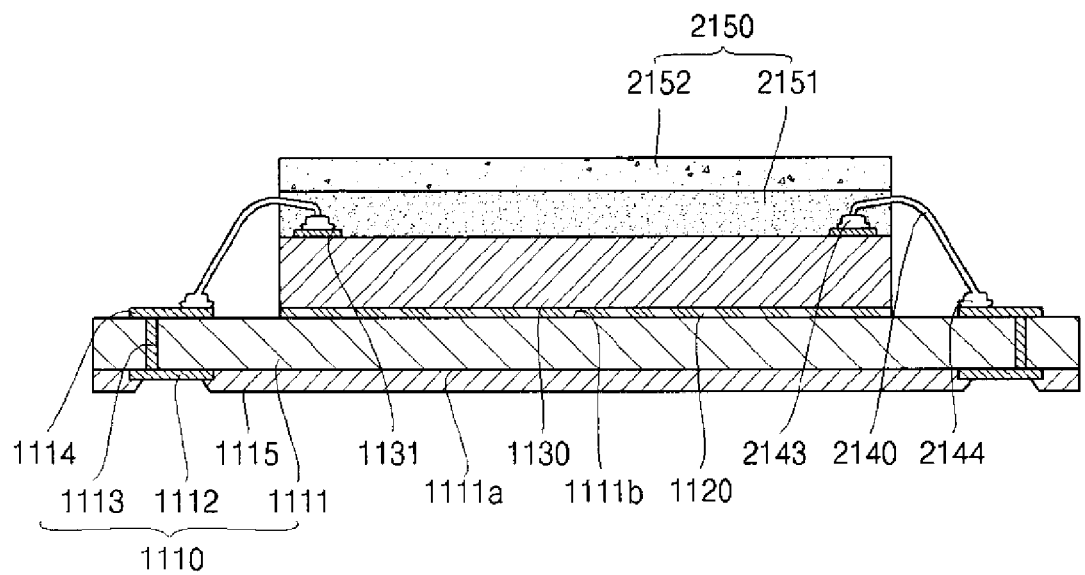

In the manufacturing process for the semiconductor package 2100 as described in relation to FIGS. 7A-7J above, the flow layer 2150 is initially formed upon the second semiconductor die 2160, and thereafter mated to the first semiconductor die 1130 (as shown in FIGS. 7F and 7G). However, as shown in FIGS. 8A and 8B, in accordance with a contemplated variation to the manufacturing methodology for the semiconductor package 2100, the flow layer 2150 may initially be formed upon the first semiconductor die 1130 subsequent to the step previously described in relation to FIG. 7D regarding the electrical connection of the first semiconductor die 1130 to the conductive pattern 1114 through the use of the first conductive wires 2140. More particularly, as shown in FIG. 8A, the first flow layer 2150 including the high and low flow layers 2151, 2152 may be attached to a separate adhesive film. Thereafter, an external arm attached to the rear surface of the adhesive film may be manipulated so as to facilitate the attachment of the flow layer 2150 to the first semiconductor die 1130 in the manner shown in FIG. 8A. Subsequent to such attachment, the adhesive film is removed from the flow layer 2150. Thereafter, the second semiconductor die 2160, and in particular the bottom surface 2160b thereof, is attached to the top surface of the flow layer 2150 which is defined by the low flow layer 2152 thereof. Upon the attachment of the second semiconductor die 2160 to the flow layer 2150, the above-described manufacturing steps as shown in FIGS. 7H-7J are completed.

Figure 3:
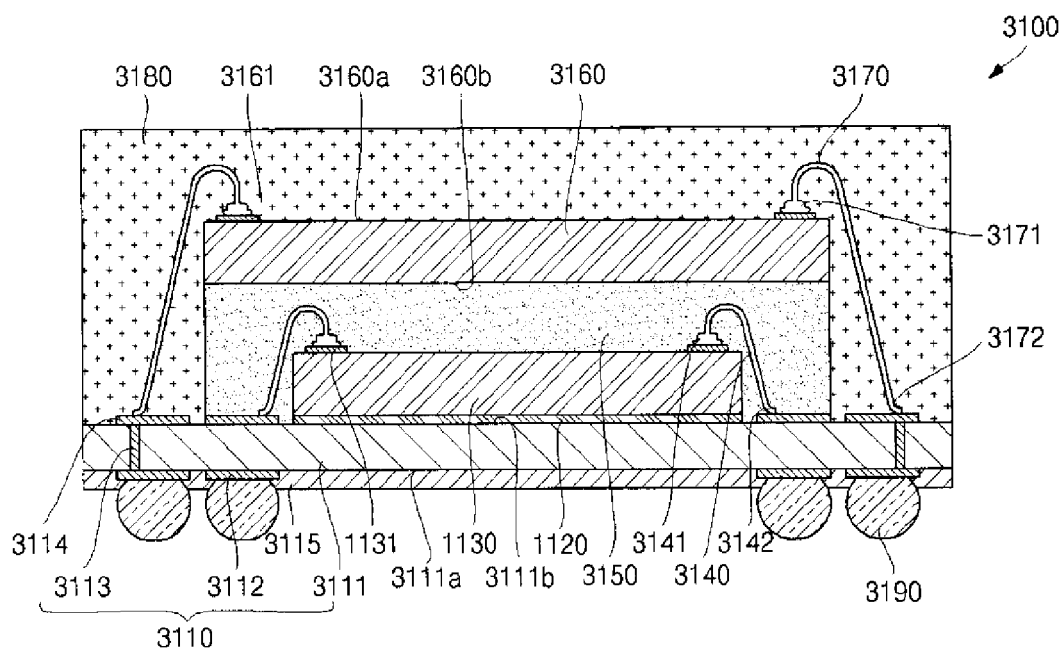
FIG. 3 is a cross-sectional view of a semiconductor package constructed in accordance with a third embodiment of the present invention.

FIG. 3 illustrates a semiconductor package 3100 constructed in accordance with a third embodiment of the present invention. The semiconductor package 3100 comprises a substrate 3110 which functions to transmit electrical signals to and from the semiconductor package 3100. The substrate 3110 comprises a thin, plate-like insulative layer 3111 which defines a generally planar first (bottom) surface 3111a and an opposed, generally planar second (top) surface 3111b. The insulative layer 3111 further comprises a third (side) surface which extends generally perpendicularly between the first and second surfaces 3111a, 3111b. The insulative layer 3111 may comprise a base film formed from a thermosetting resin, a polymer, polyimide, or an equivalent material.

The substrate 3110 further comprises one or more electrically conductive lands 3112 which are formed on the first surface 3111a in a prescribed pattern or arrangement. More particularly, the lands 3112 are preferably arranged as two concentric sets, i.e., an inner set and an outer set. As will be discussed in more detail below, these inner and outer sets are preferably dedicated to respective ones of the two semiconductor dies included in the semiconductor package 3100. Each of the lands 3112 preferably has a generally circular configuration, though different shapes for the lands 3112 are contemplated to be within the spirit and scope of the present invention. The substrate 3110 also includes an electrically conductive pattern 3114 which is formed on the second surface 3111b. The conductive pattern 3114 may comprise various pads, traces, or combinations thereof. As will also be discussed in more detail below, the conductive pattern 3114 is preferably divided into first (inner) and second (outer) regions which are dedicated to respective ones of the two semiconductor dies included in the semiconductor package 3100. In the substrate 3110, the lands 3112 and the conductive pattern 3114 are electrically connected to each other in a prescribed pattern or arrangement through the use of conductive vias 3113 which extend through the insulative layer 3111 between the first and second surfaces 3111a, 3111b thereof in the manner shown in FIG. 3. In the semiconductor package 3100, it is contemplated that the lands 3112, vias 3113 and conductive pattern 3114 will each be formed from copper or a suitable equivalent material having good electrical conductivity. With particular regard to the vias 3113, it is further contemplated that such vias 3113 may be formed by coating the walls of cylindrical apertures extending through the insulative layer 3111 with a conductive metal film as places the lands 3112 into electrical communication with the conductive pattern 3114 in a prescribed manner.

The substrate 3110 further preferably includes a solder mask 3115 which is formed on the first surface 3111a of the insulative layer 3111. As seen in FIG. 3, the solder mask 3115 is formed to surround and cover a predetermined region of the periphery of each of the lands 3112. Additionally, as is also seen in FIG. 3, it is contemplated that in the substrate 3110, solder balls 3190 will be electrically coupled to respective ones of the lands 3112, such solder balls 3190 being used to transmit electrical signals from the semiconductor package 3100 to an external device. The solder mask 3115, which contacts each of the solder balls 3190, electrically insulates each of the solder balls 3190 from the adjacent lands 3112 on which other solder balls 3190 are formed. The solder mask 3115 is preferably fabricated from a material having a good insulating property, such as benzocyclobutene (BCB) resin, polyimide, and equivalent materials.

The semiconductor package 3100 further comprises a first adhesive layer 3120 which is applied to a central portion of the second surface 3111b of the insulative layer 3111. The first adhesive layer 3120 is preferably formed to be of a prescribed thickness, and is disposed in spaced relation to the conductive pattern 3114 disposed on the second surface 3111b. The first adhesive layer 3120 preferably has a strong viscosity, and may comprise an epoxy, adhesive tape, or an equivalent material, the present invention not being limited to any particular material for the first adhesive layer 3120.

The semiconductor package 3100 further comprises a first semiconductor die 1130 which is attached to the substrate 3110, and in particular to the first adhesive layer 3120 in the manner shown in FIG. 3. In this regard, the first semiconductor die 1130 and the first adhesive layer 3120 are preferably sized relative to each other such that the peripheral edge of the first adhesive layer 3120 is substantially flush with and does not protrude beyond the side surface of the first semiconductor die 1130 which extends generally perpendicularly between the opposed, generally planar top and bottom surfaces thereof. The first semiconductor die 1130 may be formed of single crystal silicon, multi-crystal silicon, amorphous silicon, and equivalent materials thereto. The first semiconductor die 1130 is further preferably formed of a plurality of layers formed on a silicon substrate, a metal electrode for connecting the layers to an external environment, and a protective layer for protecting the metal electrode.

As is further seen in FIG. 3, the first semiconductor die 1130 further includes one or more bond pads 1131 disposed on the top surface thereof which is opposite the bottom surface contacting the first adhesive layer 3120. The bond pads 1131 are preferably located in regions of the first semiconductor die 1130 where the metal electrode thereof is exposed to the outside environment. Though the bond pads 1131 are shown in FIG. 3 as projecting outwardly relative to the top surface of the first semiconductor die 1130, those of ordinary skill in the art will recognize that such bond pads 1131 may be substantially flush with or recessed relative to the top surface of the first semiconductor die 1130. The bond pads 1131 are preferably formed from material having good conductive properties, such as aluminum, copper, or equivalent materials.

In the semiconductor package 3100, each of the bond pads 1131 is electrically coupled or connected to a prescribed portion (i.e., the inner region) of the conductive pattern 3114 through the use of an elongate, first conductive wire 3140. As is shown in FIG. 3, one end of each first conductive wire 3140 may be ball-bonded to a respective one of the bond pads 1131, with the opposed end of such first conductive wire 3140 being electrically connected to the conductive pattern 3114 through the use of, for example, a stitch-bonding technique. In this regard, each first conductive wire 3140 may include a generally spherical ball bonding portion 3141 which is formed on a respective one of the bond pads 1131, and a stitch bonding portion 3142 which is formed on a prescribed portion of the inner region of the conductive pattern 3114. As will be recognized by those of ordinary skill in the art, the first conductive wires 3140 electrically couple the bond pads 1131 and hence the first semiconductor die 1130 to the conductive pattern 3114, and hence the substrate 3110. Each conductive wire 3140 is preferably fabricated from a material having good electrical conductivity, such as aluminum, copper, gold, and equivalent materials thereto.

The semiconductor package 3100 further comprises a second adhesive layer 3150 which is applied to the top and side surfaces of the first semiconductor die 1130, to a portion of the second surface 3111b of the insulative layer 3111 of the substrate 3110, and to the inner region of the conductive pattern 3114. As seen in FIG. 3, the second adhesive layer 3150 thus covers or encapsulates the bond pads 1131, the ball bonding portions 3141, and the first conductive wires 3140 which extend between the ball bonding portions 3141 and the inner region of the conductive pattern 3114. It is contemplated that the second adhesive layer 3150 will be formed in a prescribed thickness from a material having a strong adhesive force which may be gel-type film at room temperature, and changes into a solid phase when subjected to a heat treatment process. An exemplary material for the second adhesive layer 3150 is a polymide based resin, though the present invention is not intended to be limited to any particular material for use in relation thereto.

In the semiconductor package 3100, attached to the top surface of the second adhesive layer 3150 is a second semiconductor die 3160, the size of which exceeds that of the first semiconductor die 1130. The second semiconductor die 3160 defines a generally planar first (top) surface 3160a, and an opposed, generally planar second (bottom) surface 3160b which is in direct contact with the second adhesive layer 3150. Formed on the first surface 3160a are one or more bond pads 3161. The bond pads 3161 are structurally and functionally identical to the above-described bond pads 1131 of the first semiconductor die 1130. Along these lines, like the first semiconductor die 1130 described above, the second semiconductor die 3160 may be formed of single crystal silicon, multi-crystal silicon, amorphous silicon, or equivalent materials thereto.

Similar to the above-described manner in which the first semiconductor die 1130 is electrically connected to the inner region of the conductive pattern 3114 through the use of the first conductive wires 3140, the second semiconductor die 3160 is electrically connected to prescribed portions (i.e., the outer region) of the conductive pattern 3114 through the use of second conductive wires 3170. As seen in FIG. 3, one end of each second conductive wire 3170 is ball-bonded to a respective one of the bond pads 3161 of the second semiconductor die 3160, with the other end of such second conductive wire 3170 being stitch-bonded to a prescribed portion of the outer region of the conductive pattern 3114. In this regard, each second conductive wire 3170 may include a generally spherical ball bonding portion 3171 which is formed upon a respective one of the bond pads 3161, and a stitch-bonding portion 3172 which is formed on and electrically coupled to a prescribed portion of the outer region of the conductive pattern 3114. Thus, as will be recognized by those of ordinary skill in the art, the second conductive wires 3170 electrically couple or connect the bond pads 3161 and hence the second semiconductor die 3160 to the conductive pattern 3114, and hence the substrate 3110. The second conductive wires 3170 are preferably fabricated from the same materials described above in relation to the first conductive wires 3140. Though not shown, it is further contemplated that one end of each second conductive wire 3170 may be stitch-bonded to a respective one of the bond pads 3161, with the opposed end of such second conductive wire 3170 being electrically connected to the conductive pattern 3114 through the use of a ball-bonding technique.

The semiconductor package 3100 further comprises a package body 3180 which is formed on the substrate 3110 so as to effectively cover or encapsulate the second semiconductor die 3160, the second conductive wires 3170, and the second adhesive layer 3150. The package body 3180 also covers the exposed portions of the conductive pattern 3114, and the exposed portion of the second surface 3111b of the insulative layer 3111. The package body 3180 is further preferably formed such that the side surface thereof, which extends generally perpendicularly between the generally planar top surface thereof, is substantially flush or continuous with the peripheral side surface of the insulative layer 3111 of the substrate 3110, as well as the peripheral edge of the solder mask 3115 applied to the first surface 3111a of the insulative layer 3111. As will be recognized by those of ordinary skill in the art, the package body 3180 effectively protects the internal elements of the semiconductor package 3100 described above from the external environment. The package body 3180 may be fabricated from a conventional epoxy resin, silicon resin, or an equivalent material thereto.

Referring now to FIGS. 9A-9J, there is shown an exemplary sequence of steps which may be used to facilitate the fabrication of the semiconductor package 3100 shown in FIG. 3. In the initial step of the fabrication process shown in FIG. 9A, the substrate 3110 is prepared. In preparing the substrate 3110, the insulative layer 3111 is initially provided. A metal layer is then formed to cover the totality of the first surface 3111a of the insulative layer 3111, with the lands 3112 then being patterned using a photolithography process. Via holes are then made using the photolithography process again, with the metal then being injected into each of the via holes. After the via holes are filled with the metal, such via holes are subject to a CMP process to facilitate the formation of the vias 3113. Thereafter, a metal layer is formed to cover the entirety of the second surface 3111b of the insulative layer 3111. Such metal layer is also patterned using a photolithography process to form the electrically conductive pattern 3114. Thereafter, the first surface 3111a of the insulative layer 3111 is coated with a polymer resin which is patterned to form the solder mask 3115. As previously explained, the fully formed vias 3113 place the lands 3112 into electrical communication with the conductive pattern 3114 in a prescribed pattern or arrangement.

Figure 9A:
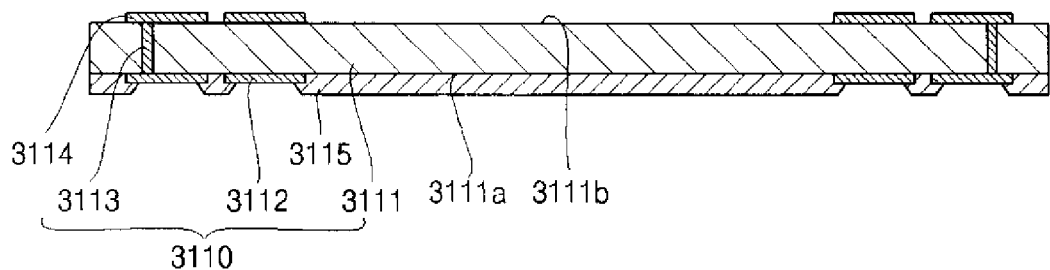
FIGS. 9A-9J illustrate an exemplary sequence of steps which may be used to facilitate the fabrication of the semiconductor package of the third embodiment shown in FIG. 3.
Figure 9B:
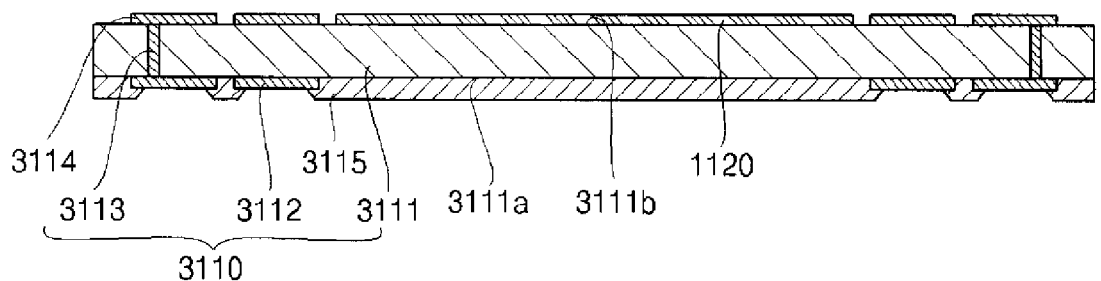

In the next step of the fabrication process shown in FIG. 9B, the first adhesive layer 1120 is applied or attached to a prescribed portion of the second surface 3111b of the insulative layer 3111. The first adhesive layer 1120 is generally in the shape of a film, though the present invention is not limited to any particular shape or material for the first adhesive layer 1120. As indicated above, the first adhesive layer 1120 may be an epoxy, an adhesive tape, or an equivalent material thereto.

Figure 9C:
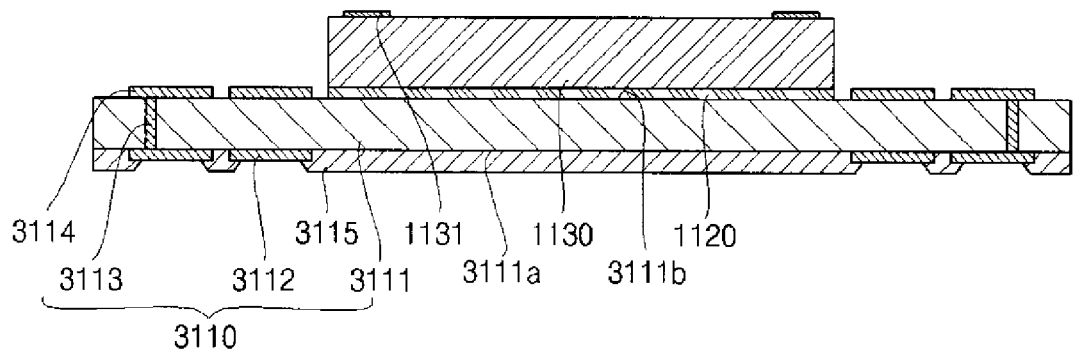

In the next step of the fabrication process for the semiconductor package 3100 shown in FIG. 9C, the first semiconductor die 1130 is attached to the top surface of the first adhesive layer 1120. More particularly, the bottom surface of this first semiconductor die 1130, which is opposite the top surface having the bond pads 1131 formed thereon, is that surface which is placed into direct contact with the first adhesive layer 1120.

Figure 9D:
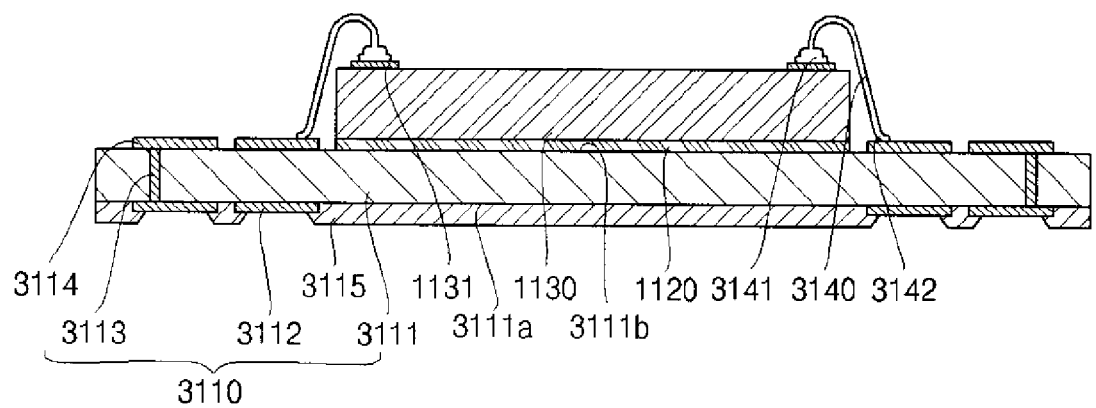

In the next step of the fabrication process shown in FIG. 9D, the first conductive wires 3140 are used to electrically connect the bond pads 1131 of the first semiconductor die 1130 to the inner region of the conductive pattern 3114 of the substrate 3110. As previously explained, one end of each first conductive wire 3140 forms a ball bonding portion 3141 on a respective one of the bond pads 1131, with the remaining end of each of the first conductive wires 3140 forming a stitch-bonding portion 3142 on a prescribed portion of the inner region of the conductive pattern 3114. Each of the conductive wires 3140 is preferably formed through the use of a capillary, and may be formed in a forward folded loop mode. Though not shown, it is contemplated that each first conductive wire 3140 may alternatively be formed in a reverse loop mode. More particularly, one end of each of the first conductive wires 3140 may form a ball bonding portion on a prescribed portion of the conductive pattern 3114, with the other end of each such first conductive wire 3140 forming a stitch-bonding portion on a respective one of the bond pads 1131, such reverse loop mode first conductive wires 3140 also being formed through the use of a capillary.

Figure 9E:
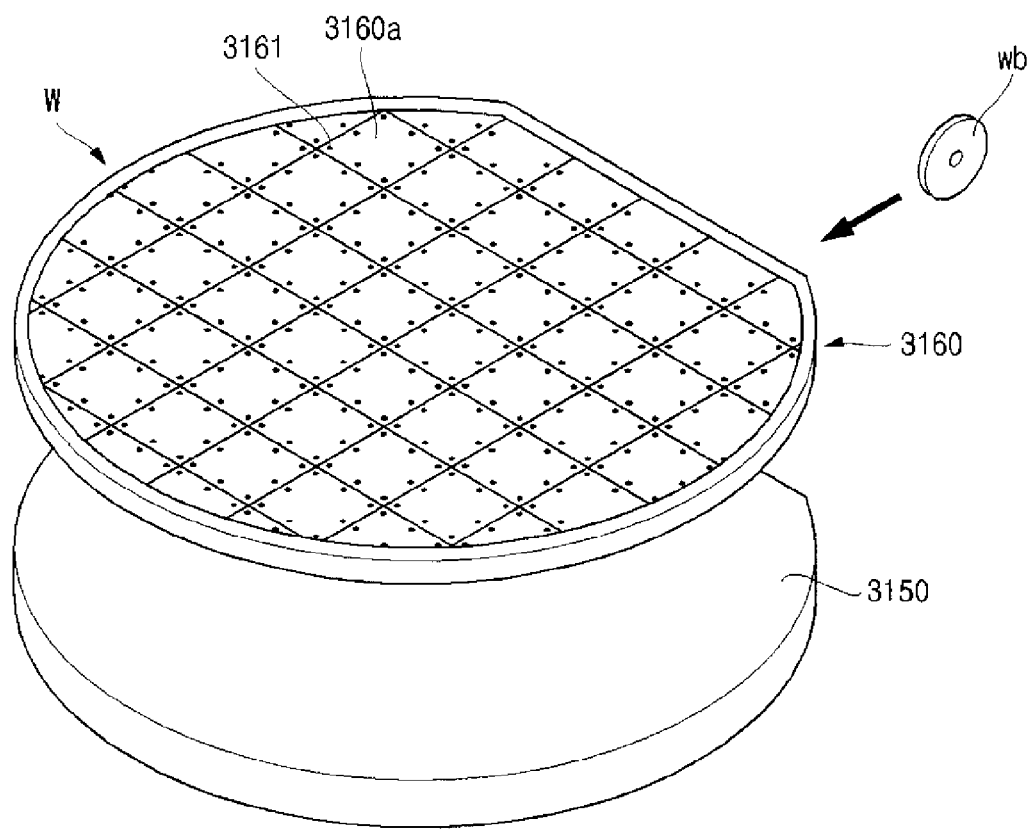
Figure 9F:
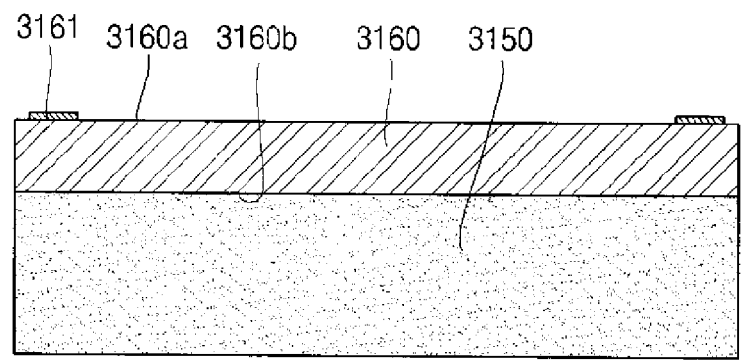

In the next step of the fabrication process shown in FIGS. 9E and 9F, the second semiconductor die 3160 is provided. Initially, a plurality of the second semiconductor dies 3160 are provided in a single wafer, such semiconductor dies 3160 being integrally connected to each other within the wafer. The second adhesive layer 3150 is then applied to a common surface of such wafer. Subsequent to the application of the second adhesive layer 3150 thereto, the wafer is sawed independently using a diamond blade. As will be recognized, such saw singulation process effectively separates the wafer into the second semiconductor dies 3160, each of which includes a second adhesive layer 3150 applied thereto. A semiconductor die 3160 as singulated from the wafer is shown in FIG. 9F. Though called out as a separate step in relation to FIGS. 9E and 9F, those of ordinary skill in the art will recognize that the step of providing the second semiconductor die 3160 may be conducted concurrently with any of the prior steps shown in relation to FIGS. 9A-9D.

Figure 9G:
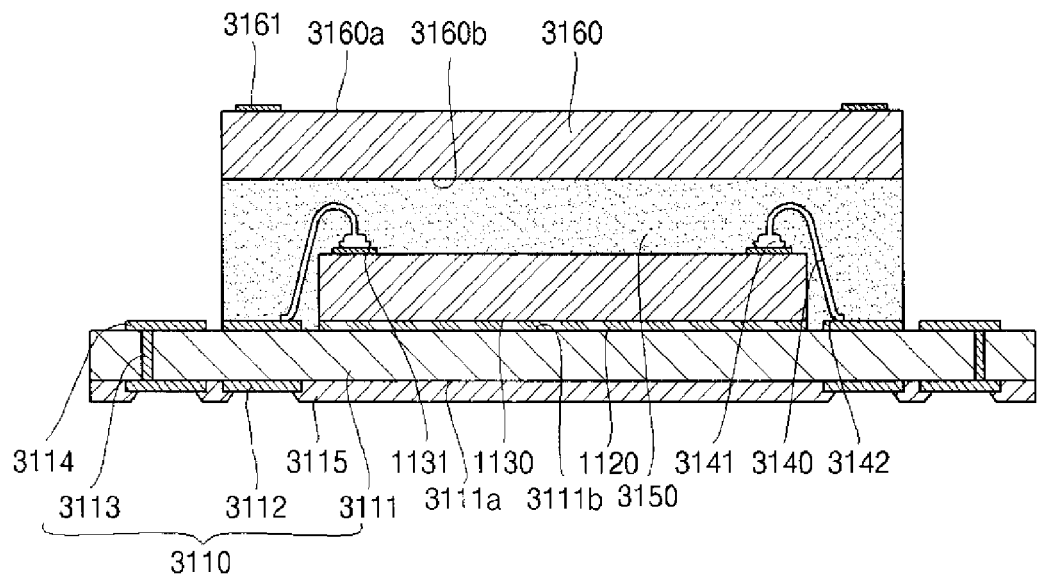

In the next step of the fabrication process shown in FIG. 9G, the second semiconductor die 3160, which includes the second adhesive layer 3150 applied thereto, is attached to the first semiconductor die 1130 and to the substrate 3110. More particularly, as explained above, the second adhesive layer 3150 is applied to the top and side surfaces of the first semiconductor die 1130, to a portion of the second surface 3211b of the insulative layer 3111 of the substrate 3110, and to the inner region of the conductive pattern 3114. The second adhesive layer 3150 thus covers or encapsulates the bond pads 1131, the ball bonding portions 3141, and the first conductive wires 3140 which extend between the ball bonding portions 3141 and the inner region of the conductive pattern 3114. As is further shown in FIG. 9G, the size of the second semiconductor die 3160 exceeds that of the first semiconductor die 1130, with the second adhesive layer thus protruding outwardly beyond the side surface of the first semiconductor die 1130. After the second adhesive layer applied to the second semiconductor die 3160 has been mated to the first semiconductor die 1130 and to the substrate 3110 in the aforementioned manner, the second adhesive layer 3150 is cured. As indicated above, the second adhesive layer 3150 may be gel-type film at room temperature, and changes into a solid phase when subjected to a heat treatment process. More particularly, the second adhesive layer 3150 is preferably cured by subjecting the same to a temperature in the range of from about 40° C. to about 100° C. If the temperature is less than about 40° C., the curing time is excessively long, and the shape of the second adhesive layer 3150 could be altered before the second semiconductor die 3160 is fixed into a correct position. If the temperature exceeds about 100° C., the second adhesive layer 3150 may be cured before a complete encapsulation of the first semiconductor die 1130 and the first conductive wires 3140 occurs, thus potentially creating undesirable gaps and hence an inadequate seal these elements and the second adhesive layer 3150.

Figure 9H:
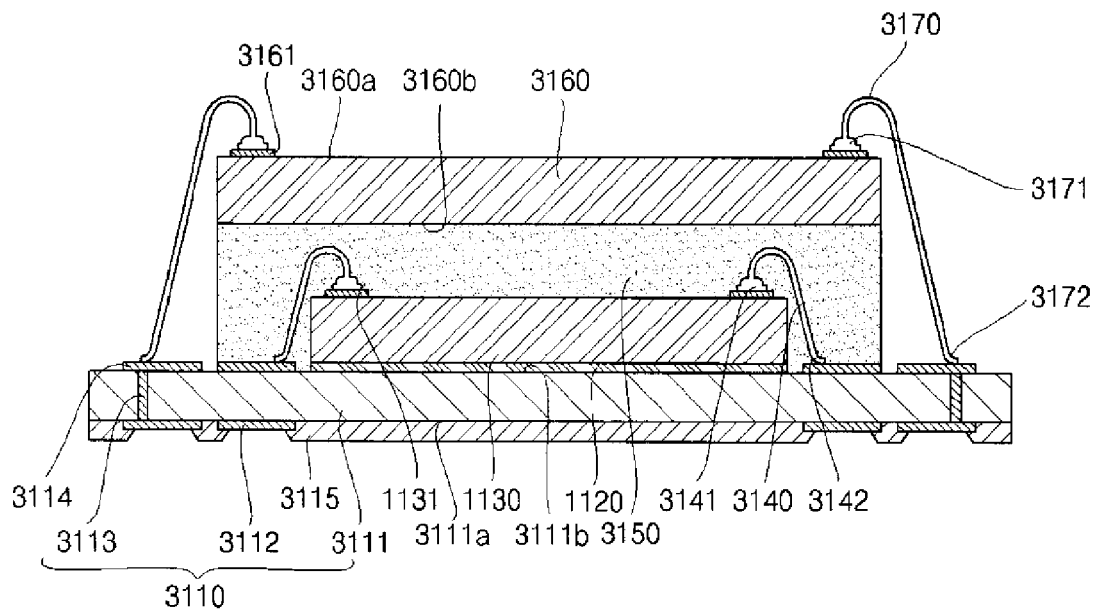

In the next step of the fabrication process shown in FIG. 9H, the second conductive wires 3170 are used to electrically connect the bond pads 3161 of the second semiconductor die 3160 to the conductive pattern 3114 and hence the substrate 3110. The second conductive wires 3170 may each be formed in accordance with the same options described above in relation to the first conductive wires 3140 shown in FIG. 9D.

Figure 9I:
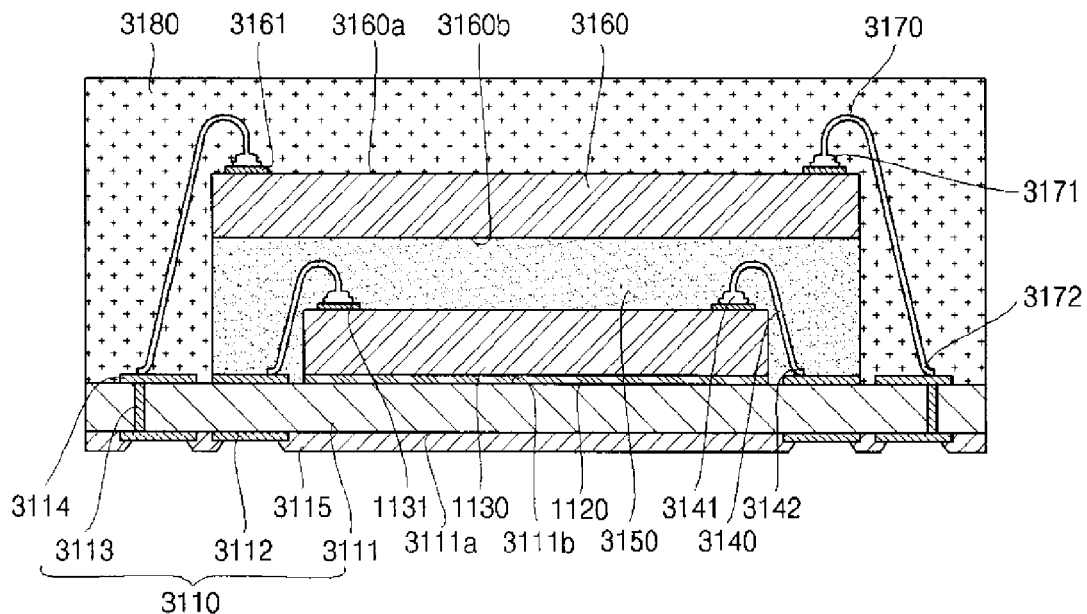

In the next step of the fabrication process shown in FIG. 9I, the package body 3180 is formed on the top surface of the substrate 3110 so as to cover the second semiconductor die 3160, the second conductive wires 3170, and the second adhesive layer 3150 in the above-described manner. It is contemplated that the package body 1180 may be formed by injecting one of the above-described materials in a liquid state into a suitable mold.

Figure 9J:
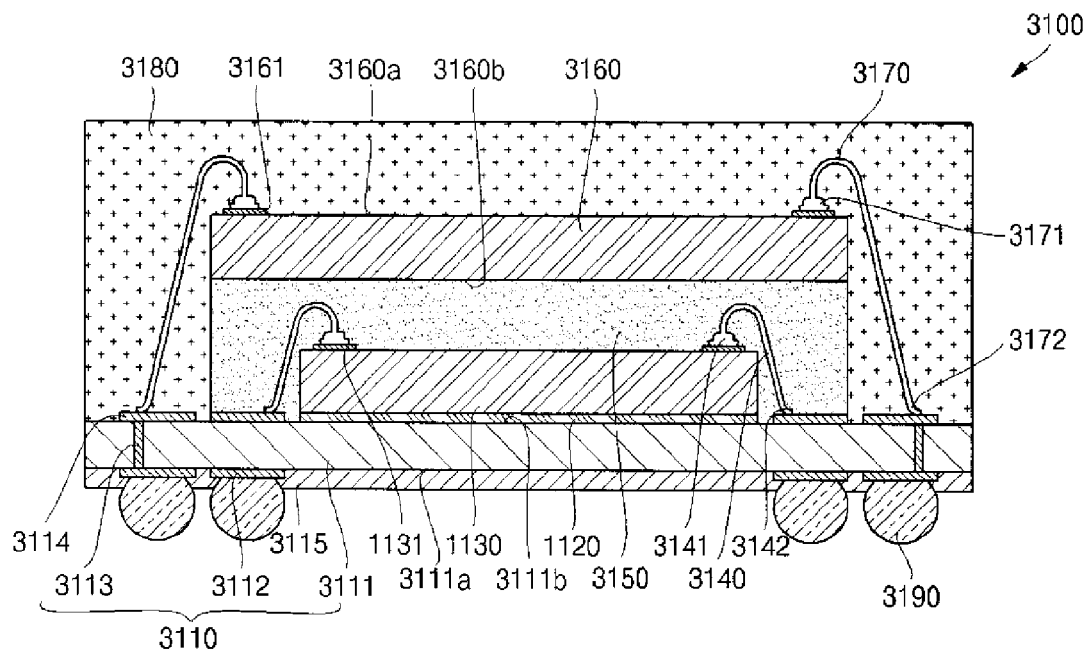

In the last step of the fabrication process for the semiconductor package 3100 as shown in FIG. 9J, the solder balls 3190 are mounted and electrically connected to the exposed portions of respective ones of the lands 3112 of the substrate 3110. In this regard, it is contemplated that each of the solder balls 3190 may be formed through the use of a reflowing and subsequent cooling procedure known by those of ordinary skill in the art. The solder balls 3190 are each preferably spherically configured, and may be fabricated from tin, lead and/or silver that is easy to produce and handle, and has a low melting point.

Figure 10A:
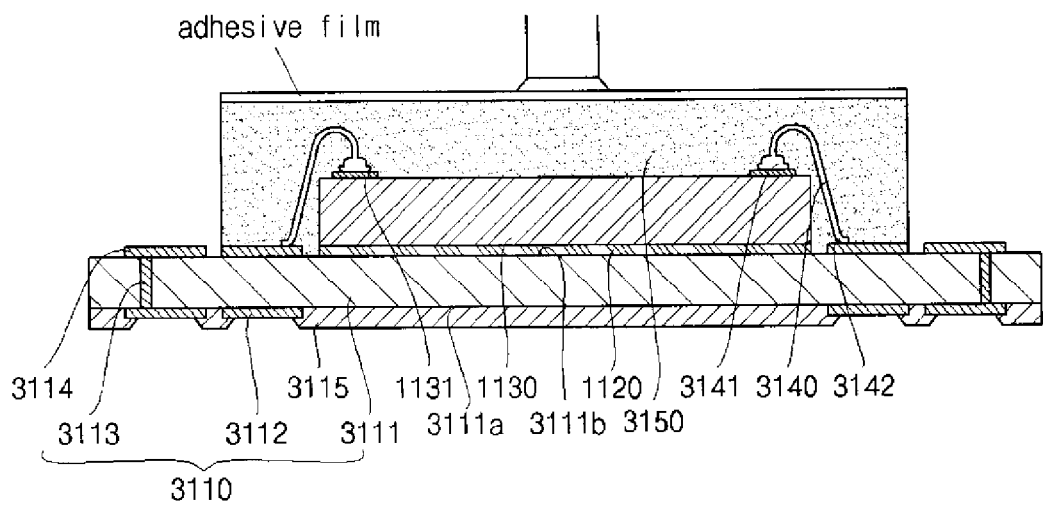
FIGS. 10A and 10B illustrate exemplary steps which may be employed as an alternative to certain steps shown in FIGS. 9A-9J to facilitate the fabrication of the semiconductor package of the third embodiment shown in FIG. 3.
Figure 10B:
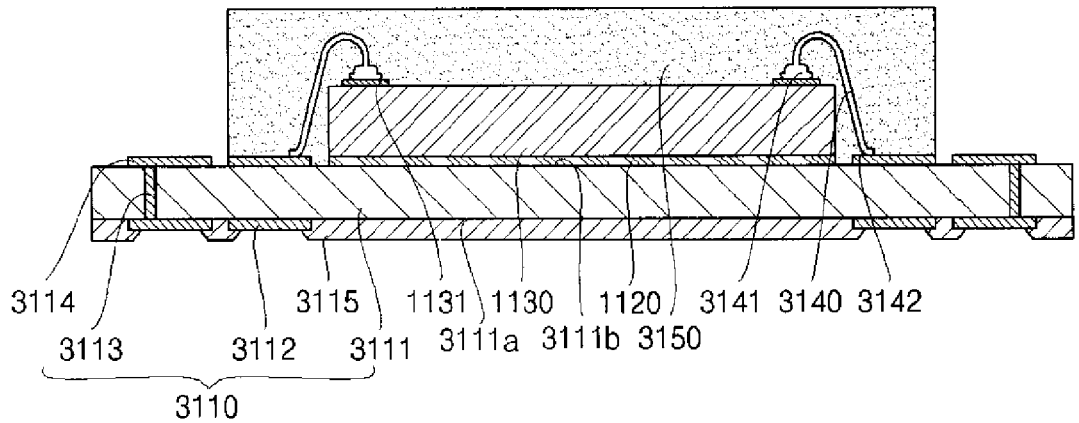

In the manufacturing process for the semiconductor package 3100 as described in relation to FIGS. 9A-9J above, the second adhesive layer 3150 is initially formed upon the second semiconductor die 3160, and thereafter mated to the first semiconductor die 1130 (as shown in FIGS. 9F and 9G). However, as shown in FIGS. 10A and 10B, in accordance with a contemplated variation to the manufacturing methodology for the semiconductor package 3100, the second adhesive layer 3150 may initially be formed upon the first semiconductor die 1130 subsequent to the step previously described in relation to FIG. 9D regarding the electrical connection of the first semiconductor die 1130 to the conductive pattern 3114 through the use of the first conductive wires 3140. More particularly, as shown in FIG. 10A, the second adhesive layer 3150 may be attached to a separate adhesive film. Thereafter, an external arm attached to the rear surface of the adhesive film may be manipulated so as to facilitate the attachment of the second adhesive layer 3150 to the first semiconductor die 1130 and the substrate 3110 in the manner shown in FIG. 10A. Subsequent to such attachment, the adhesive film is removed from the second adhesive layer 3150. Thereafter, the second semiconductor die 3160, and in particular the bottom surface 3160b thereof, is attached to the top surface of the second adhesive layer 3150. Upon the attachment of the second semiconductor die 3160 to the second adhesive layer 3150, the above-described manufacturing steps as shown in FIGS. 9H-9J are completed.

Figure 4:
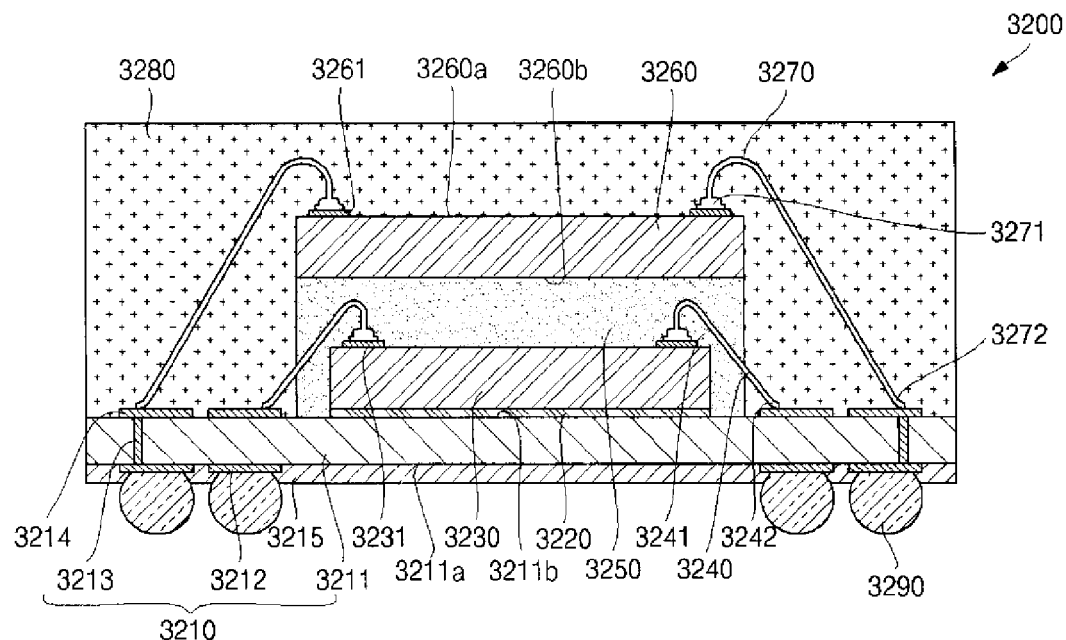
FIG. 4 is a cross-sectional view of a semiconductor package constructed in accordance with a fourth embodiment of the present invention.

FIG. 4 illustrates a semiconductor package 3200 constructed in accordance with a fourth embodiment of the present invention. The semiconductor package 3200 comprises a substrate 3210 which functions to transmit electrical signals to and from the semiconductor package 3200. The substrate 3210 comprises a thin, plate-like insulative layer 3211 which defines a generally planar first (bottom) surface 3211a and an opposed, generally planar second (top) surface 3211b. The insulative layer 3211 further comprises a third (side) surface which extends generally perpendicularly between the first and second surfaces 3211a, 3211b. The insulative layer 3211 may comprise a base film formed from a thermosetting resin, a polymer, polyimide, or an equivalent material.

The substrate 3210 further comprises one or more electrically conductive lands 3212 which are formed on the first surface 3211a in a prescribed pattern or arrangement. More particularly, the lands 3112 are preferably arranged as two concentric sets, i.e., an inner set and an outer set. As will be discussed in more detail below, these inner and outer sets are preferably dedicated to respective ones of the two semiconductor dies included in the semiconductor package 3200. Each of the lands 3212 preferably has a generally circular configuration, though different shapes for the lands 3212 are contemplated to be within the spirit and scope of the present invention. The substrate 3210 also includes an electrically conductive pattern 3214 which is formed on the second surface 3211b. The conductive pattern 3214 may comprise various pads, traces, or combinations thereof. As will also be discussed in more detail below, the conductive pattern 3214 is preferably divided into first (inner) and second (outer) regions which are dedicated to respective ones of the two semiconductor dies included in the semiconductor package 3200. In the substrate 3210, the lands 3212 and the conductive pattern 3214 are electrically connected to each other in a prescribed pattern or arrangement through the use of conductive vias 3213 which extend through the insulative layer 3211 between the first and second surfaces 3211a, 3211b thereof in the manner shown in FIG. 4. In the semiconductor package 3200, it is contemplated that the lands 3212, vias 3213 and conductive pattern 3214 will each be formed from copper or a suitable equivalent material having good electrical conductivity. With particular regard to the vias 3213, it is further contemplated that such vias 3213 may be formed by coating the walls of cylindrical apertures extending through the insulative layer 3211 with a conductive metal film as places the lands 3212 into electrical communication with the conductive pattern 3214 in a prescribed manner.

The substrate 3210 further preferably includes a solder mask 3215 which is formed on the first surface 3211a of the insulative layer 3211. As seen in FIG. 4, the solder mask 3215 is formed to surround and cover a predetermined region of the periphery of each of the lands 3212. Additionally, as is also seen in FIG. 4, it is contemplated that in the substrate 3210, solder balls 3290 will be electrically coupled to respective ones of the lands 3212, such solder balls 3290 being used to transmit electrical signals from the semiconductor package 3200 to an external device. The solder mask 3215, which contacts each of the solder balls 3290, electrically insulates each of the solder balls 3290 from the adjacent lands 3212 on which other solder balls 3290 are formed. The solder mask 3215 is preferably fabricated from a material having a good insulating property, such as benzocyclobutene (BCB) resin, polyimide, and equivalent materials.

The semiconductor package 3200 further comprises a first adhesive layer 3220 which is applied to a central portion of the second surface 3211b of the insulative layer 3211. The first adhesive layer 3220 is preferably formed to be of a prescribed thickness, and is disposed in spaced relation to the conductive pattern 3214 disposed on the second surface 3211b. The first adhesive layer 3220 preferably has a strong viscosity, and may comprise an epoxy, adhesive tape, or an equivalent material, the present invention not being limited to any particular material for the first adhesive layer 3220.

The semiconductor package 3200 further comprises a first semiconductor die 3230 which is attached to the substrate 3210, and in particular to the first adhesive layer 3220 in the manner shown in FIG. 4. In this regard, the first semiconductor die 3230 and the first adhesive layer 3220 are preferably sized relative to each other such that the peripheral edge of the first adhesive layer 3220 is substantially flush with and does not protrude beyond the side surface of the first semiconductor die 3230 which extends generally perpendicularly between the opposed, generally planar top and bottom surfaces thereof. The first semiconductor die 3230 may be formed of single crystal silicon, multi-crystal silicon, amorphous silicon, and equivalent materials thereto. The first semiconductor die 1130 is further preferably formed of a plurality of layers formed on a silicon substrate, a metal electrode for connecting the layers to an external environment, and a protective layer for protecting the metal electrode.

As is further seen in FIG. 4, the first semiconductor die 3230 further includes one or more bond pads 3231 disposed on the top surface thereof which is opposite the bottom surface contacting the adhesive layer 3220. The bond pads 3231 are preferably located in regions of the first semiconductor die 3230 where the metal electrode thereof is exposed to the outside environment. Though the bond pads 3231 are shown in FIG. 4 as projecting outwardly relative to the top surface of the first semiconductor die 3230, those of ordinary skill in the art will recognize that such bond pads 3231 may be substantially flush with or recessed relative to the top surface of the first semiconductor die 3230. The bond pads 3231 are preferably formed from material having good conductive properties, such as aluminum, copper, or equivalent materials.

In the semiconductor package 3200, each of the bond pads 3231 is electrically coupled or connected to a prescribed portion (i.e., the inner region) of the conductive pattern 3214 through the use of an elongate, first conductive wire 3240. As is shown in FIG. 4, one end of each first conductive wire 3240 may be ball-bonded to a respective one of the bond pads 3231, with the opposed end of such first conductive wire 3240 being electrically connected to the conductive pattern 3214 through the use of, for example, a stitch-bonding technique. In this regard, each first conductive wire 3240 may include a generally spherical ball bonding portion 3241 which is formed on a respective one of the bond pads 3231, and a stitch bonding portion 3242 which is formed on a prescribed portion of the inner region of the conductive pattern 3214. As will be recognized by those of ordinary skill in the art, the first conductive wires 3240 electrically couple the bond pads 3231 and hence the first semiconductor die 3230 to the conductive pattern 3214, and hence the substrate 3210. Each conductive wire 3240 is preferably fabricated from a material having good electrical conductivity, such as aluminum, copper, gold, and equivalent materials thereto.

The semiconductor package 3200 further comprises a second adhesive layer 3250 which is applied to the top and side surfaces of the first semiconductor die 3230, and to a portion of the second surface 3211b of the insulative layer 3211 of the substrate 3210. As seen in FIG. 4, the second adhesive layer 3250 thus covers or encapsulates the bond pads 3231, the ball bonding portions 3241, and portions of the first conductive wires 3240 which extend between the ball bonding portions 3241 and the inner region of the conductive pattern 3214. Thus, the first conductive wires 3240 protrude from the second adhesive layer 3250 in the manner shown in FIG. 4. It is contemplated that the second adhesive layer 3250 will be formed in a prescribed thickness from a material having a strong adhesive force which may be gel-type film at room temperature, and changes into a solid phase when subjected to a heat treatment process. An exemplary material for the second adhesive layer 3250 is a polymide based resin, though the present invention is not intended to be limited to any particular material for use in relation thereto.

In the semiconductor package 3200, attached to the top surface of the second adhesive layer 3250 is a second semiconductor die 3260, the size of which exceeds that of the first semiconductor die 3230. The second semiconductor die 3260 defines a generally planar first (top) surface 3260a, and an opposed, generally planar second (bottom) surface 3260b which is in direct contact with the second adhesive layer 3250. Formed on the first surface 3260a are one or more bond pads 3261. The bond pads 3261 are structurally and functionally identical to the above-described bond pads 3231 of the first semiconductor die 3230. Along these lines, like the first semiconductor die 3230 described above, the second semiconductor die 3260 may be formed of single crystal silicon, multi-crystal silicon, amorphous silicon, or equivalent materials thereto.

Similar to the above-described manner in which the first semiconductor die 3230 is electrically connected to the inner region of the conductive pattern 3214 through the use of the first conductive wires 3240, the second semiconductor die 3260 is electrically connected to prescribed portions (i.e., the outer region) of the conductive pattern 3214 through the use of second conductive wires 3270. As seen in FIG. 4, one end of each second conductive wire 3270 is ball-bonded to a respective one of the bond pads 3261 of the second semiconductor die 3260, with the other end of such second conductive wire 3270 being stitch-bonded to a prescribed portion of the outer region of the conductive pattern 3214. In this regard, each second conductive wire 3270 may include a generally spherical ball bonding portion 3271 which is formed upon a respective one of the bond pads 3261, and a stitch-bonding portion 3272 which is formed on and electrically coupled to a prescribed portion of the outer region of the conductive pattern 3214. Thus, as will be recognized by those of ordinary skill in the art, the second conductive wires 3270 electrically couple or connect the bond pads 3261 and hence the second semiconductor die 3260 to the conductive pattern 3214, and hence the substrate 3210. The second conductive wires 3270 are preferably fabricated from the same materials described above in relation to the first conductive wires 3240. Though not shown, it is further contemplated that one end of each second conductive wire 3270 may be stitch-bonded to a respective one of the bond pads 3261, with the opposed end of such second conductive wire 3270 being electrically connected to the conductive pattern 3214 through the use of a ball-bonding technique.

The semiconductor package 3200 further comprises a package body 3280 which is formed on the substrate 3210 so as to effectively cover or encapsulate the second semiconductor die 3260, the second conductive wires 3270, the exposed portions of the first conductive wires 3240, and the second adhesive layer 3250. The package body 3280 also covers the exposed portions of the conductive pattern 3214, and the exposed portion of the second surface 3211b of the insulative layer 3211. The package body 3280 is further preferably formed such that the side surface thereof, which extends generally perpendicularly between the generally planar top surface thereof, is substantially flush or continuous with the peripheral side surface of the insulative layer 3211 of the substrate 3210, as well as the peripheral edge of the solder mask 3215 applied to the first surface 3211a of the insulative layer 3211. As will be recognized by those of ordinary skill in the art, the package body 3280 effectively protects the internal elements of the semiconductor package 3200 described above from the external environment. The package body 3280 may be fabricated from a conventional epoxy resin, silicon resin, or an equivalent material thereto.

Though not separately shown, those of ordinary skill in the art will recognize that the manufacturing process for the semiconductor package 3200 mirrors that for the semiconductor package 3100 as discussed in relation to FIGS. 9A-9J, 10A and 10B above. In this regard, the sole variation between the semiconductor packages 3100, 3200 lies in the slightly smaller sizes of the first and second semiconductor dies 3230, 3260 in comparison to respective ones of the first and second semiconductor dies 1130, 3160, and hence the smaller size of the second adhesive layer 3250 in comparison to the second adhesive layer 3150.

Figure 5:
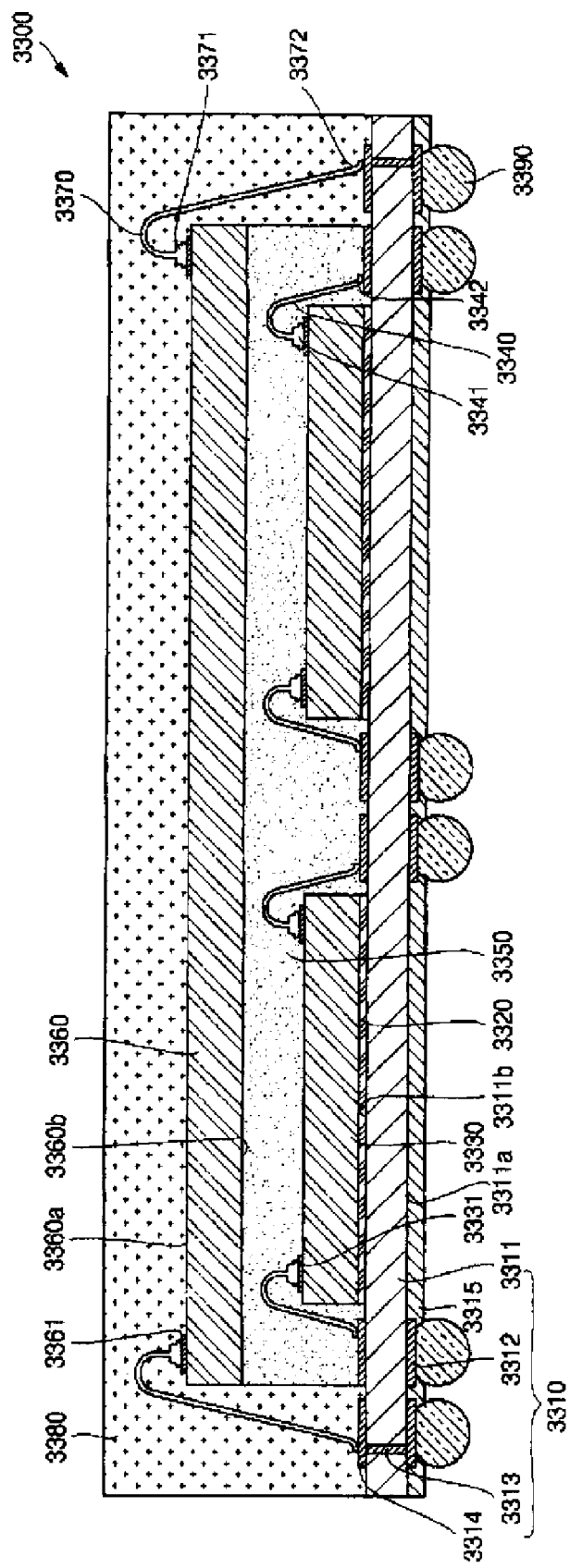
FIG. 5 is a cross-sectional view of a semiconductor package constructed in accordance with a fifth embodiment of the present invention.

FIG. 5 illustrates a semiconductor package 3300 constructed in accordance with a fifth embodiment of the present invention. The semiconductor package 3300 comprises a substrate 3310 which functions to transmit electrical signals to and from the semiconductor package 3300. The substrate 3310 comprises a thin, plate-like insulative layer 3311 which defines a generally planar first (bottom) surface 3311a and an opposed, generally planar second (top) surface 3311b. The insulative layer 3311 further comprises a third (side) surface which extends generally perpendicularly between the first and second surfaces 3311a, 3311b. The insulative layer 3311 may comprise a base film formed from a thermosetting resin, a polymer, polyimide, or an equivalent material.

The substrate 3110 further comprises one or more electrically conductive lands 3312 which are formed on the first surface 3311a in a prescribed pattern or arrangement. More particularly, the lands 3312 may be arranged as two concentric sets, i.e., an inner set and an outer set which are disposed in close proximity to the peripheral edge of the insulative layer 3311, and may further be included in the central region of the first, bottom surface 3311a thereof. As will be discussed in more detail below, these inner and outer sets are preferably dedicated to respective ones of the two semiconductor dies included in the semiconductor package 3300. Each of the lands 3312 preferably has a generally circular configuration, though different shapes for the lands 3312 are contemplated to be within the spirit and scope of the present invention. The substrate 3310 also includes an electrically conductive pattern 3314 which is formed on the second surface 3311b. The conductive pattern 3314 may comprise various pads, traces, or combinations thereof. As will also be discussed in more detail below, the conductive pattern 3314 is preferably divided into first (inner) and second (outer) regions which are dedicated to respective ones of the two semiconductor dies included in the semiconductor package 3300. In the substrate 3310, the lands 3312 and the conductive pattern 3314 are electrically connected to each other in a prescribed pattern or arrangement through the use of conductive vias 3313 which extend through the insulative layer 3311 between the first and second surfaces 3311a, 3311b thereof in the manner shown in FIG. 5. In the semiconductor package 3300, it is contemplated that the lands 3312, vias 3313 and conductive pattern 3314 will each be formed from copper or a suitable equivalent material having good electrical conductivity. With particular regard to the vias 3313, it is further contemplated that such vias 3313 may be formed by coating the walls of cylindrical apertures extending through the insulative layer 3311 with a conductive metal film as places the lands 3312 into electrical communication with the conductive pattern 3314 in a prescribed manner.

The substrate 3310 further preferably includes a solder mask 3315 which is formed on the first surface 3311a of the insulative layer 3311. As seen in FIG. 5, the solder mask 3315 is formed to surround and cover a predetermined region of the periphery of each of the lands 3312. Additionally, as is also seen in FIG. 5, it is contemplated that in the substrate 3310, solder balls 3390 will be electrically coupled to respective ones of the lands 3312, such solder balls 3390 being used to transmit electrical signals from the semiconductor package 3300 to an external device. The solder mask 3315, which contacts each of the solder balls 3390, electrically insulates each of the solder balls 3390 from the adjacent lands 3312 on which other solder balls 3390 are formed. The solder mask 3315 is preferably fabricated from a material having a good insulating property, such as benzocyclobutene (BCB) resin, polyimide, and equivalent materials.

The semiconductor package 3300 further comprises a first and second adhesive layers 3320, 3320a which are each applied to the second surface 3311b of the insulative layer 3311. The first and second adhesive layers 3320, 3320a are preferably formed to be of a prescribed thickness, and are disposed in spaced relation to each other, and to the conductive pattern 3314 disposed on the second surface 3311b. The first and second adhesive layers 3320, 3320a each preferably have a strong viscosity, and may comprise an epoxy, adhesive tape, or an equivalent material, the present invention not being limited to any particular material for the first and second adhesive layers 3320, 3320a.

The semiconductor package 3300 further comprises a first semiconductor die 3330 which is attached to the substrate 3310, and in particular to the first adhesive layer 3320 in the manner shown in FIG. 5. In this regard, the first semiconductor die 3330 and the first adhesive layer 3320 are preferably sized relative to each other such that the peripheral edge of the first adhesive layer 3320 is substantially flush with and does not protrude beyond the side surface of the first semiconductor die 3330 which extends generally perpendicularly between the opposed, generally planar top and bottom surfaces thereof. The semiconductor package 3300 also includes a second semiconductor die 3330a which is attached to the substrate 3310, and in particular to the second adhesive layer 3320a in the manner also shown in FIG. 5. In this regard, the second semiconductor die 3330a and the second adhesive layer 3320 are preferably sized relative to each other such that the peripheral edge of the second adhesive layer 3320a is substantially flush with and does not protrude beyond the side surface of the second semiconductor die 3330a which extends generally perpendicularly between the opposed, generally planar top and bottom surfaces thereof. The first and second semiconductor dies 3330, 3330a may each be formed of single crystal silicon, multi-crystal silicon, amorphous silicon, and equivalent materials thereto. The first and second semiconductor dies 3330, 3330a are further each preferably formed of a plurality of layers formed on a silicon substrate, a metal electrode for connecting the layers to an external environment, and a protective layer for protecting the metal electrode.

As is further seen in FIG. 5, the first semiconductor die 3330 further includes one or more bond pads 3331 disposed on the top surface thereof which is opposite the bottom surface contacting the first adhesive layer 3320. The bond pads 3331 are preferably located in regions of the first semiconductor die 3330 where the metal electrode thereof is exposed to the outside environment. Though the bond pads 3331 are shown in FIG. 5 as projecting outwardly relative to the top surface of the first semiconductor die 3330, those of ordinary skill in the art will recognize that such bond pads 3331 may be substantially flush with or recessed relative to the top surface of the first semiconductor die 3330. Similarly, the second semiconductor die 3330a further includes one or more bond pads 3331a disposed on the top surface thereof which is opposite the bottom surface contacting the second adhesive layer 3320a. The bond pads 3331a are preferably located in regions of the second semiconductor die 3330a where the metal electrode thereof is exposed to the outside environment. Though the bond pads 3331a are also shown in FIG. 5 as projecting outwardly relative to the top surface of the second semiconductor die 3330a, those of ordinary skill in the art will recognize that such bond pads 3331a may be substantially flush with or recessed relative to the top surface of the second semiconductor die 3330a. The bond pads 3331, 3331a are preferably formed from material having good conductive properties, such as aluminum, copper, or equivalent materials.

In the semiconductor package 3300, each of the bond pads 3331 is electrically coupled or connected to a prescribed portion (i.e., the inner region) of the conductive pattern 3314 through the use of an elongate, first conductive wire 3340. As is shown in FIG. 5, one end of each first conductive wire 3340 may be ball-bonded to a respective one of the bond pads 3331, with the opposed end of such first conductive wire 3340 being electrically connected to the conductive pattern 3314 through the use of, for example, a stitch-bonding technique. In this regard, each first conductive wire 3340 may include a generally spherical ball bonding portion 3241 which is formed on a respective one of the bond pads 3331, and a stitch bonding portion 3342 which is formed on a prescribed portion of the inner region of the conductive pattern 3314. As will be recognized by those of ordinary skill in the art, the first conductive wires 3340 electrically couple the bond pads 3331 and hence the first semiconductor die 3330 to the conductive pattern 3314, and hence the substrate 3310.

Similarly, each of the bond pads 3331a is electrically coupled or connected to a prescribed portion (i.e., the inner region) of the conductive pattern 3314 through the use of an elongate, second conductive wire 3340a. As is shown in FIG. 5, one end of each second conductive wire 3340a may be ball-bonded to a respective one of the bond pads 3331a, with the opposed end of such second conductive wire 3340a being electrically connected to the conductive pattern 3314 through the use of, for example, a stitch-bonding technique. In this regard, each second conductive wire 3340a may include a generally spherical ball bonding portion 3241a which is formed on a respective one of the bond pads 3331a, and a stitch bonding portion 3342a which is formed on a prescribed portion of the inner region of the conductive pattern 3314. As will be recognized by those of ordinary skill in the art, the second conductive wires 3340a electrically couple the bond pads 3331a and hence the second semiconductor die 3330a to the conductive pattern 3314, and hence the substrate 3310. Each conductive wire 3140, 3140a is preferably fabricated from a material having good electrical conductivity, such as aluminum, copper, gold, and equivalent materials thereto.

The semiconductor package 3300 further comprises a third adhesive layer 3350 which is applied to the top and side surfaces of each of the first and second semiconductor dies 3330, 3330a, to a portion of the second surface 3311b of the insulative layer 3311 of the substrate 3310, and to the inner region of the conductive pattern 3314. As seen in FIG. 5, the third adhesive layer 3350 thus covers or encapsulates the bond pads 3331, 3331a, the ball bonding portions 3341, 3341a, and the first and second conductive wires 3340, 3340a which extend between the ball bonding portions 3341, 3341a and the inner region of the conductive pattern 3314. It is contemplated that the third adhesive layer 3350 will be formed in a prescribed thickness from a material having a strong adhesive force which may be gel-type film at room temperature, and changes into a solid phase when subjected to a heat treatment process. An exemplary material for the third adhesive layer 3350 is a polymide based resin, though the present invention is not intended to be limited to any particular material for use in relation thereto.

In the semiconductor package 3300, attached to the top surface of the third adhesive layer 3350 is a third semiconductor die 3360, the size of which exceeds that of each of the first and second semiconductor dies 3330, 3330a. The third semiconductor die 3360 defines a generally planar first (top) surface 3360a, and an opposed, generally planar second (bottom) surface 3360b which is in direct contact with the third adhesive layer 3350. Formed on the first surface 3360a are one or more bond pads 3361. The bond pads 3361 are structurally and functionally identical to the above-described bond pads 3331, 3331a of the first and second semiconductor dies 3330, 3330a. Along these lines, like the first and second semiconductor dies 3330, 3330a described above, the third semiconductor die 3360 may be formed of single crystal silicon, multi-crystal silicon, amorphous silicon, or equivalent materials thereto.

Similar to the above-described manner in which the first and second semiconductor dies 3330, 3330a are electrically connected to the inner region of the conductive pattern 3314 through the use of the first and second conductive wires 3340, 3340a, the third semiconductor die 3360 is electrically connected to prescribed portions (i.e., the outer region) of the conductive pattern 3314 through the use of third conductive wires 3370. As seen in FIG. 5, one end of each third conductive wire 3370 is ball-bonded to a respective one of the bond pads 3361 of the third semiconductor die 3360, with the other end of such third conductive wire 3370 being stitch-bonded to a prescribed portion of the outer region of the conductive pattern 3314. In this regard, each third conductive wire 3370 may include a generally spherical ball bonding portion 3371 which is formed upon a respective one of the bond pads 3361, and a stitch-bonding portion 3372 which is formed on and electrically coupled to a prescribed portion of the outer region of the conductive pattern 3314. Thus, as will be recognized by those of ordinary skill in the art, the third conductive wires 3370 electrically couple or connect the bond pads 3361 and hence the third semiconductor die 3360 to the conductive pattern 3314, and hence the substrate 3310. The third conductive wires 3370 are preferably fabricated from the same materials described above in relation to the first and second conductive wires 3340, 3340a. Though not shown, it is further contemplated that one end of each third conductive wire 3370 may be stitch-bonded to a respective one of the bond pads 3361, with the opposed end of such third conductive wire 3370 being electrically connected to the conductive pattern 3314 through the use of a ball-bonding technique.

The semiconductor package 3300 further comprises a package body 3380 which is formed on the substrate 3310 so as to effectively cover or encapsulate the third semiconductor die 3360, the third conductive wires 3170, and the third adhesive layer 3350. The package body 3380 also covers the exposed portions of the conductive pattern 3314, and the exposed portion of the second surface 3311b of the insulative layer 3311. The package body 3380 is further preferably formed such that the side surface thereof, which extends generally perpendicularly between the generally planar top surface thereof, is substantially flush or continuous with the peripheral side surface of the insulative layer 3311 of the substrate 3310, as well as the peripheral edge of the solder mask 3315 applied to the first surface 3311a of the insulative layer 3311. As will be recognized by those of ordinary skill in the art, the package body 3380 effectively protects the internal elements of the semiconductor package 3300 described above from the external environment. The package body 3380 may be fabricated from a conventional epoxy resin, silicon resin, or an equivalent material thereto.

Though also not separately shown, those of ordinary skill in the art will recognize that the manufacturing process for the semiconductor package 3300 is substantially similar to that used for the semiconductor package 3100 as discussed in relation to FIGS. 9A-9J, 10A and 10B above. In this regard, the major variation between the semiconductor packages 3100, 3300 lies in the inclusion of the additional semiconductor die 3330a in the semiconductor package 3300.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
a substrate;
a first semiconductor die electrically connected to the substrate through the use of first conductive wires;
a flow layer applied to a least a portion of the first semiconductor die;
a second semiconductor die attached to the flow layer and electrically connected to the substrate; and
a package body at least partially encapsulating the first semiconductor die, the second semiconductor die, the flow layer, the first conductive wires, and the substrate;
the flow layer including at least first and second portions which are of differing viscosities, with the first conductive wires each further being partially encapsulated by at least one of the first and second portions of the flow layer.

2. The semiconductor package of claim 1 wherein the substrate comprises:
an insulative layer defining opposed first and second surfaces;
a plurality of lands disposed on the first surface; and
a conductive pattern disposed on the second surface and electrically connected to the lands in a prescribed manner;
the first and second semiconductor dies each being electrically connected to the conductive pattern.

3. The semiconductor package of claim 1 wherein the first portion of the flow layer is of a first viscosity, and the second portion of the flow layer is of a second viscosity which exceeds the first viscosity.

4. The semiconductor package of claim 3 wherein the first conductive wires are each partially encapsulated by the first portion of the flow layer and partially encapsulated by the package body.

5. The semiconductor package of claim 4 wherein the second semiconductor die is electrically connected to the conductive pattern through the use of second conductive wires which are encapsulated by the package body.

6. The semiconductor package of claim 5, wherein:
the conductive pattern defines an inner region and an outer region;
the first conductive wires each extend to the inner region; and
the second conductive wires each extend to the outer region.

7. A semiconductor package, comprising:
a substrate;

a first semiconductor die electrically connected to the substrate through the use of first conductive wires;

a high flow layer applied to at least a portion of the first semiconductor die and covering at least a portions of the first conductive wires;

a low flow layer applied to at least a portion of the high flow layer;

a second semiconductor die attached to the low flow layer and electrically connected to the substrate; and a package body at least partially encapsulating the first semiconductor die, the second semiconductor die, the high and low flow layers, the first conductive wires, and the substrate.

8. The semiconductor package of claim 7 wherein the substrate comprises:
an insulative layer defining opposed first and second surfaces;
a plurality of lands disposed on the first surface; and
a conductive pattern disposed on the second surface and electrically connected to the lands in a prescribed manner;
the first and second semiconductor dies each being electrically connected to the conductive pattern.

9. The semiconductor package of claim 8 wherein the first surface of the insulative layer and portions of each of the lands are covered by a solder mask.

10. The semiconductor package of claim 8 wherein the lands each include a solder ball electrically connected thereto.

11. The semiconductor package of claim 7 wherein the second semiconductor die is electrically connected to the conductive pattern through the use of second conductive wires which are encapsulated by the package body.

12. The semiconductor package of claim 11, wherein:
the conductive pattern defines an inner region and an outer region;
the first conductive wires each extend to the inner region; and
the second conductive wires each extend to the outer region.

13. The semiconductor package of claim 7 wherein the second semiconductor die is of a size approximately equal to that of the first semiconductor die.

14. The semiconductor package of claim 7 wherein the high flow layer is of a first viscosity, and the low flow layer is of a second viscosity differing from the first viscosity.

15. The semiconductor package of claim 14 wherein the first viscosity falls within the range of from about 5,000 poise to about 13,500 poise, and the second viscosity falls within the range of from about 13,500 poise to about 50,000 poise.

16. A method of fabricating a semiconductor package, comprising the steps of:
a) providing a substrate;
b) attaching a first semiconductor die to the substrate;
c) electrically connecting the first semiconductor die to the conductive pattern of the substrate through the use of first conductive wires;
d) covering at least portions of the first semiconductor die, the first conductive wires, and the substrate with a flow layer which is attached to a second semiconductor die and includes at least first and second portions which are of differing viscosities;
e) electrically connecting the second semiconductor die to the substrate; and
f) forming a package body to at least partially encapsulate the first semiconductor, the first conductive wires, the second semiconductor die, the flow layer, and the substrate.

17. The method of claim 16 wherein step (d) comprises covering at least portions of the first semiconductor die, the first conductive wires, and the substrate with a flow layer wherein the first portion is of a first viscosity, and the second portion is of a second viscosity which exceeds the first viscosity.

18. The method of claim 17 wherein step (d) comprises covering portions of the first conductive wires with the first portion of the flow layer.

19. The semiconductor package of claim 16 wherein:
step (e) comprises electrically connecting the second semiconductor die to the substrate through the use of second conductive wires; and
step (f) comprises encapsulating the second conductive with the package body.

20. A method of fabricating a semiconductor package, comprising the steps of:
a) providing a substrate;
b) attaching a first semiconductor die to the substrate;
c) electrically connecting the first semiconductor die to the conductive pattern of the substrate through the use of first conductive wires;
d) covering at least portions of the first semiconductor die, the first conductive wires, and the substrate with a flow layer includes at least first and second portions which are of differing viscosities;
e) attaching a second semiconductor die to the flow layer;
f) electrically connecting the second semiconductor die to the substrate; and
g) forming a package body to at least partially encapsulate the first semiconductor, the first conductive wires, the second semiconductor die, the flow layer, and the substrate.

* * * * *